United States Patent [19]
Shibuya et al.

[11] Patent Number: 5,929,976
[45] Date of Patent: Jul. 27, 1999

[54] PROCESS FOR EXPOSING A PERIPHERAL AREA OF A WAFER AND A DEVICE FOR EXECUTING THE PROCESS

[75] Inventors: Isamu Shibuya; Takeshi Minore; Yoshiki Mimura, all of Yokohama, Japan

[73] Assignee: Ushiodenki Kabushiki Kaisha, Tokyo, Japan

[21] Appl. No.: 08/794,829

[22] Filed: Feb. 5, 1997

[30] Foreign Application Priority Data

Feb. 5, 1996 [JP] Japan ................................. 8-018625
Jun. 21, 1996 [JP] Japan ................................. 8-161443

[51] Int. Cl.$^6$ .......................... G03B 27/42; G03B 27/54
[52] U.S. Cl. ............................................. 355/53; 355/67
[58] Field of Search ................................ 355/50, 53, 67, 355/77; 430/22; 356/400, 401; 250/548

[56] References Cited

U.S. PATENT DOCUMENTS

| | | | |
|---|---|---|---|
| 4,899,195 | 2/1990 | Gotoh | 355/77 |
| 5,168,021 | 12/1992 | Arai et al. | 430/22 |
| 5,229,811 | 7/1993 | Hattori et al. | 355/50 |
| 5,249,016 | 9/1993 | Tanaka | 355/53 |
| 5,289,263 | 2/1994 | Kiyokawa et al. | 356/357 |
| 5,359,389 | 10/1994 | Isohata | 355/53 |
| 5,420,663 | 5/1995 | Nakajima et al. | 355/50 |

FOREIGN PATENT DOCUMENTS 4-291938 10/1992 Japan .

OTHER PUBLICATIONS

Patent Abstracts of Japan, vol. 17, No. 104 (E–1328), Mar. 3, 1993, & JP 04 291914 A (USHIO Inc.), Oct. 16, 1992, * Abstract *.
Patent Abstracts of Japan, vol. 14, No. 444 (E–0982), Sep. 21, 1990 & JP 02 177420 A (USIO Inc.), Jul. 10, 1990, * Abstract *.

*Primary Examiner*—Eddie C. Lee
*Assistant Examiner*—Hung Henry Nguyen
*Attorney, Agent, or Firm*—Sixbey, Friedman, Leedom & Ferguson; David S. Safran

[57] ABSTRACT

A process for exposing the peripheral area of a wafer and a device for executing the process is provided to enable both step-shaped exposure and also ring-shaped exposure of part of the peripheral area of a wafer using a single arrangement. The device includes a rotary carrier for receiving a wafer having resist thereon, which is moved and rotated based on the position of the wafer on the carrier, the position of a singular point formed on an edge of the wafer, such as an "ori-fla" and the like, and furthermore alignment mark position information, to position the wafer in a stipulated position. Then, using an X-Y carrier, the rotary carrier is moved as exposure light is radiated from a first exit part to expose some of the peripheral area of the wafer in a step shape. Next, the rotary carrier is moved again and rotated, and exposure light emitted from a second exit part to expose a not yet exposed part of the peripheral area of the wafer in a ring-shape. A fiber changeover unit may be positioned and the exposure light introduced into an exit part from a single light source.

7 Claims, 16 Drawing Sheets

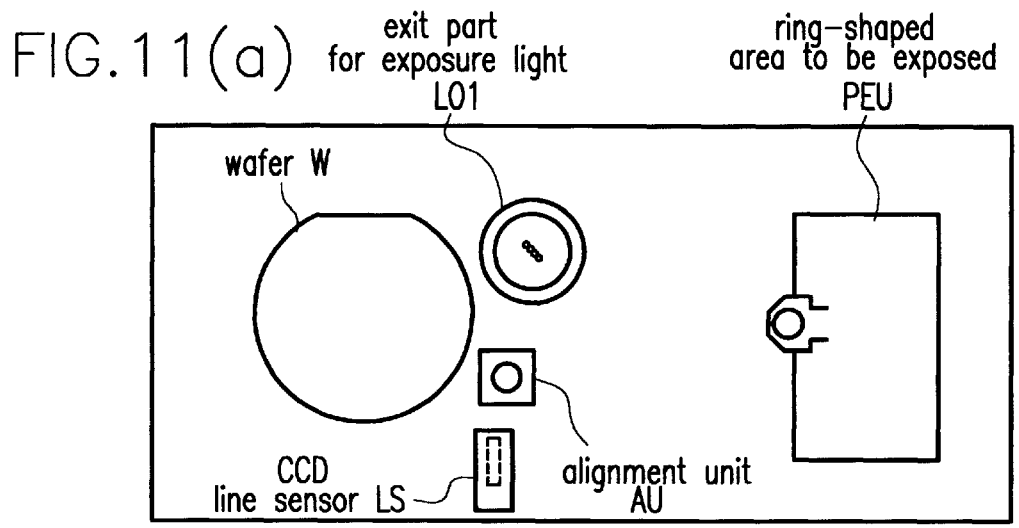
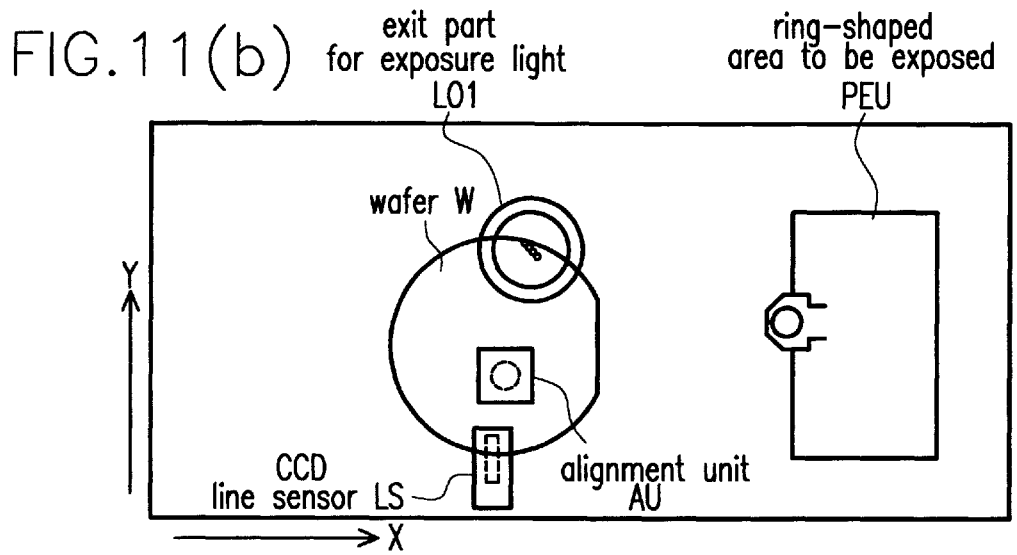
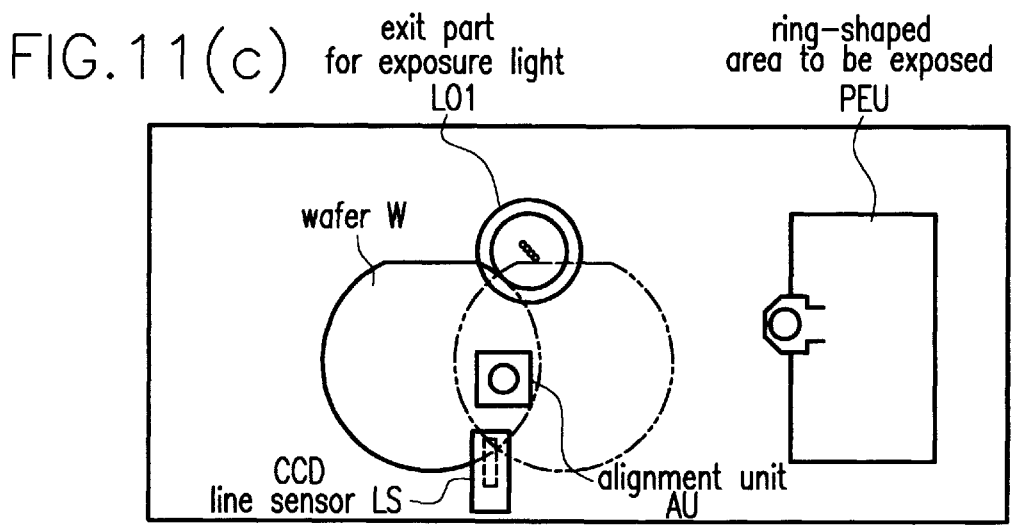

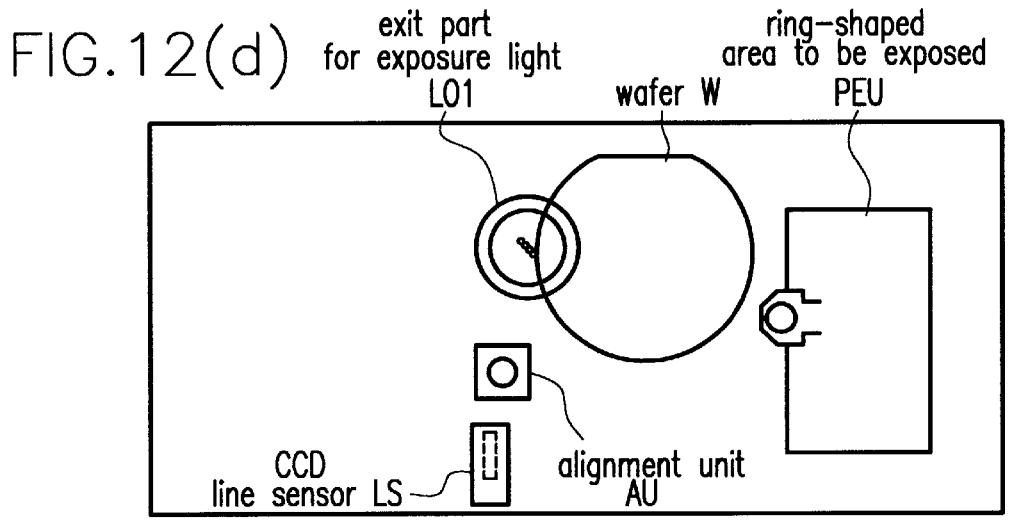
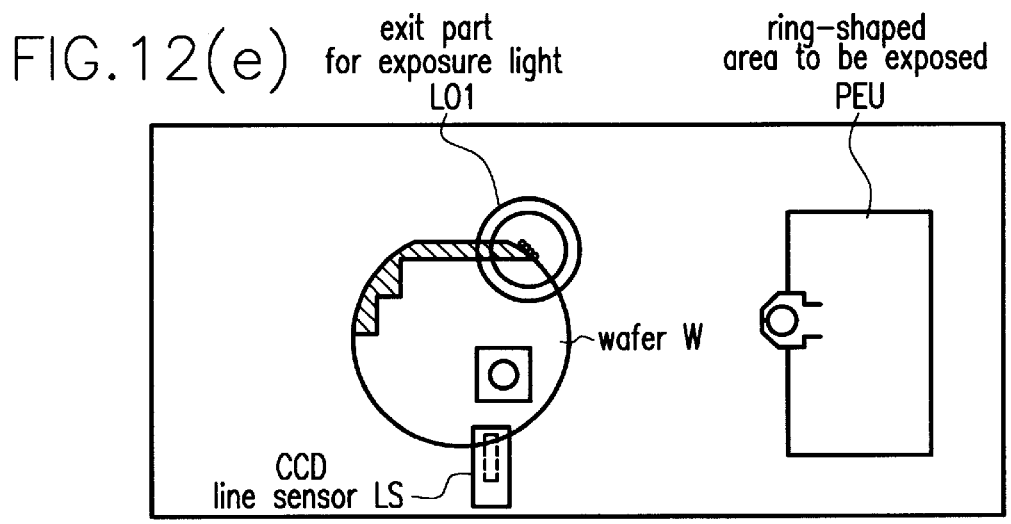
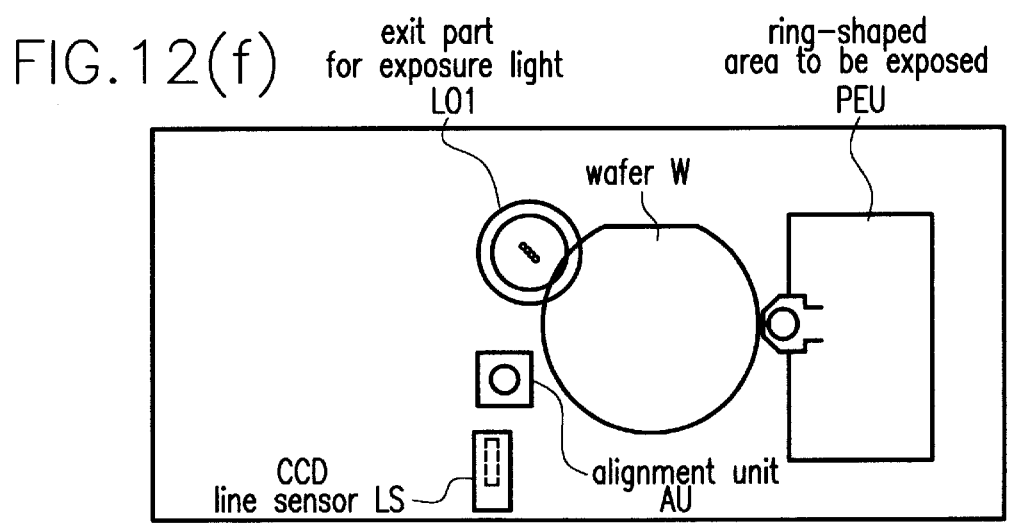

PROCESS FOR EXPOSING A PERIPHERAL AREA OF A WAFER AND A DEVICE FOR EXECUTING THE PROCESS

BACKGROUND OF THE INVENTION

1. Field of the Invention

The invention relates to a process for exposing the peripheral area of a wafer, a process which is used for removal of an unnecessary resist on a wafer in a development process, and a device for executing the process. The invention relates especially to a process for exposing the peripheral area of a wafer, in which some of the peripheral area of the wafer is exposed in a step shape and the remainder is exposed in a ring shape, and a device for executing the process.

2. Description of the Related Art

In the manufacture of a semiconductor device, for example, an IC, LSI or the like, a photoresist (hereafter called a resist) is applied to the surface of a semiconductor wafer (hereafter called a wafer), such as a silicon wafer or the like. In this manner, a circuit pattern is formed.

The peripheral area of a wafer, however, is only rarely used as an area in which the pattern is formed. In the case in which the resist is a positive resist, the peripheral area is not exposed, and as a result, the resist remains in the peripheral area even after development. This resist which has remained in the peripheral area causes impurities on peripheral devices and, as a result, impurities on the wafer surface and thus a reduction in yield due to loosening or the like during transportation and holding of the wafer.

Therefore, a proposal has been advanced for removing the unnecessary resist in the peripheral area of the wafer. To do this, a process for exposing the peripheral area of the wafer is carried out in which, regardless of the process of exposure in the area in which the pattern is formed, the unnecessary resist in the peripheral area is removed.

Conventionally, the processes described below have been used as processes for exposure of the above described peripheral area of a wafer:

(1) While one exit end, from which exposure light emerges, is moved parallel to the wafer surface in orthogonally intersecting directions, the peripheral area of the wafer is irradiated with the exposure light. Alternatively, instead of the exit end, the wafer may be moved. The process exposes the peripheral area of the wafer in a step shape, as is illustrated in FIG. 17(a). This exposure process is hereinafter called step-shaped exposure.

(2) While rotating a wafer on which the resist has been applied, the peripheral area of the wafer is irradiated with exposure light by which the entire periphery, or part, of the wafer is exposed in a ring shape, as is illustrated in FIG. 17(b). This exposure process is hereinafter called ring-shaped exposure.

The step-shaped exposure described above in (1) is often used for exposure of a peripheral area in the case in which the circuit pattern on the wafer is gradually exposed using a reduction projection exposure device of the movement type (stepper). In the above described gradual exposure, the periphery of the area to be exposed, in which the circuit pattern is formed, is formed in a step shape which changes according to the exposure pattern because several circuit patterns, which each correspond to one chip at a time, are formed on the wafer.

Therefore, in the peripheral area of the wafer, a step-shaped part is formed which is not yet exposed and some of the unnecessary resist has a step shape. This unnecessary resist causes the above described decrease of yield due to loosening or the like. The peripheral area of the wafer is therefore exposed in a step-shape by the process described above in (1), by which formation of the not yet exposed part on the wafer is prevented.

Recently, there has been a greater demand for exposure of the peripheral area of the wafer in which the above described step-shaped and ring-shaped exposures are used at the same time. In this process, some of the peripheral area of the wafer is exposed in a step-shape and the remainder is exposed in a ring-shape, as is illustrated in FIG. 17(c). To satisfy this demand, conventionally two exposure devices are used, i.e., one exposure device for step-shaped exposure of the peripheral area of the wafer, as disclosed in, for example, Japanese patent disclosure document HEI 4-291938, and one exposure device for ring-shaped exposure of the peripheral area of the wafer, as disclosed in, for example, Japanese patent disclosure document HEI 2-1114 (U.S. Pat. No. 4,899,195). Thus, two processes for exposure of the peripheral area of a wafer are executed. One of the devices is used to expose some of the peripheral area of the wafer, for example, in a step-shape, and then the wafer is transported to the other of the devices which exposes the remainder of the peripheral area of the wafer in a ring-shape.

The above described prior art, however, has the following disadvantages:

(1) It is necessary to make available two exposure devices, that is, the exposure device for step-shaped exposure of the peripheral area of a wafer, and the exposure device for ring-shaped exposure of the peripheral area, which increases the floor surface occupied by the exposure devices in a clean room.

(2) It is necessary to place the wafer on one of the exposure devices, to determine the placed state of the wafer, execute positioning and exposure, transport the wafer to the other exposure device, and then, again, to determine the placed state of the wafer, and to execute positioning and exposure. For this reason several working processes are necessary.

(3) To execute the above described exposures at the same station, use of an exposure device for step-shaped exposure of the peripheral area of a wafer is conceivable. However, in this case, the following problem occurs:

As is known, for example, from Japanese patent disclosure document HEI 4-291938, in the above described exposure device, position data of the exit end, from which the exposure light emerges, is computed as two-dimensional rectangular coordinates. Position control of the above described exit end is then performed. For ring-shaped exposure of the peripheral area of a wafer, it is therefore necessary to increase the resolution of the above described rectangular coordinates. As a result, the amount of data is increased and a memory with greater capacity is necessitated. Furthermore, if a microprocessor unit (MPU) which has a high working speed is not used, the throughput decreases compared to the exposure device which is known, for example, from Japanese patent disclosure document HEI 2-1114. Thus, the device becomes expensive. If the resolution of the above described data is reduced, there is the tendency that the above described problem is solved. However, instead, on the boundary of the area to be exposed in a ring-shape, there is an extremely small step-shape and loosening of the resist proceeds from this boundary area.

SUMMARY OF THE INVENTION

Therefore, the first object of the invention is to provide a process for exposure of the peripheral area of a wafer in which some of the peripheral area of the wafer can be exposed in a step-shape and the remainder can be exposed in a ring-shape without determining the placed state of the wafer twice.

The second object of the invention is to provide a device for exposing the peripheral area of a wafer in which, by using a single device, some of the peripheral area of the wafer can be exposed in a step-shape and the remainder can be exposed in a ring shape, without transporting the wafer between the two devices or without determining the placed state of the wafer twice.

The third object of the invention is to provide a device for exposure of the peripheral area of a wafer in which using one light source for purposes of exposure, some of the peripheral area of a wafer can be exposed in a step-shape and the remainder can be exposed in a ring shape.

The above described objects are achieved according to the process of the present invention for exposure of the peripheral area of a wafer, in which the peripheral area of a semiconductor wafer with a peripheral edge which is provided with a singular point with respect to its shape, such as an "orientation flat", "notch" and the like, and on which surface a photoresist has been applied, is irradiated using exposure light, and in which an unnecessary resist is exposed outside the area on the semiconductor wafer in which the pattern is formed, by the following process steps:

a) Storage of position information via alignment marks which are recorded beforehand on the above described semiconductor wafer;

b) Placement of the above described wafer, on which the resist has been applied, on a rotary carrier which is positioned at a first station, and determination and storage of both the placed state of the above described wafer on the rotary carrier and the position of the singular point on the above described wafer;

c) Subsequent movement/rotation of the above described rotary carrier based on the above described determined and stored state in which the wafer is placed, based on the determined and stored position of the singular point of the wafer, and based on stored position information about the alignment marks such that the above described alignment marks are determined;

d) Determination and storage of the positions of the alignment marks recorded on the above described wafer;

e) Movement/rotation of the above described rotary carrier based on the above described determined and stored positions of the alignment marks such that the exposure light from a first exit part for the exposure light is radiated onto a first exposure initial position on the above described wafer;

f) Irradiation of the peripheral area of a wafer with exposure light from the above described first exit part by moving the above described rotary carrier parallel to the wafer surface in orthogonally intersecting directions to achieve step-shaped exposure of part of the peripheral area of the wafer;

g) Subsequent movement of the above described rotary carrier from the first station to the second station, and rotation thereof, based on the above described and stored state in which the above described wafer is placed, and based on the determined and stored position of the singular point of the above described wafer, so that the exposure light from a second exit part is radiated onto a second exposure initial position in a not yet exposed part of the peripheral area of a wafer; and h) Subsequent turning of the rotary carrier at the above described second station, radiation of the exposure light from the above described second exposure initial position onto the not yet exposed part of the above described wafer, and thus ring-shaped exposure of the peripheral area of the above described wafer.

In terms of hardware, the objects are achieved according to the invention by a device for exposing the peripheral area of a wafer which exposes the peripheral area of a semiconductor wafer having a photoresist, wherein the device includes a rotary carrier on which the above described wafer is placed, and which rotates the above described wafer; an X-Y carrier for moving the above described rotary carrier parallel to the wafer surface and at the same time in orthogonally intersecting directions; a first exit part for the exposure light which is located at a first station which emits exposure light onto the above described wafer on the rotary carrier which is moved by the above described X-Y carrier in orthogonally intersecting directions, and which exposes the peripheral area of the wafer in a step-shape; and a second exit part for the exposure light which is located at a second station which radiates the exposure light onto the above described wafer on the rotary carrier which rotates, and which exposes the peripheral area of a wafer in a ring-shape.

The objects are also achieved according to the invention by a device for exposing the peripheral area of a wafer, having a photoresist formed on a surface thereof, which exposes the peripheral area of a semiconductor wafer with a peripheral edge which is provided with a singular point with respect to its shape, such as an "orientation flat", a "notch" and the like, having the following features: a rotary carrier on which the above described wafer is placed, and which rotates the above described wafer; an X-Y carrier for moving the above described rotary carrier parallel to the wafer surface and at the same time in orthogonally intersecting directions; a sensor for determining the state in which the above described wafer is placed on the above described rotary carrier, the position of the singular point of the above described wafer and of alignment marks which are recorded on the above described wafer; a control means which, based on the output of the above described sensor, drives the above described X-Y carrier which at the same time rotates the rotary carrier and which controls the position of the above described rotary carrier and its angle of rotation to stipulated values; a first exit part for the exposure light which is located at a first station for emitting exposure light onto the above described wafer on the rotary carrier which is moved by the above described X-Y carrier in orthogonally intersecting directions, and which exposes the peripheral area of the wafer in a step-shape; and a second exit part for the exposure light which is located at a second station for radiating the exposure light onto the above described wafer on the rotary carrier which moves and rotates according to the edge position of the above described wafer in its radial direction, and which exposes the peripheral area of a wafer in a ring-shape.

The objects of the invention are furthermore achieved by providing the sensor in the above described device with a means for determining the position of the peripheral area of a wafer which determines the position of the peripheral edge area of the wafer on the rotating rotary carrier, and alignment units which determine the positions of the alignment marks recorded on the wafer. The above described control means stores location information on the above described alignment marks and, based on the output of the above described means for determining the position of the peripheral area of the wafer, determines a measure of the deviation of the wafer middle from the center of rotation of the rotary carrier and the position of the singular point of the wafer. Based on the above described amount of deviation, the above described position of the singular point of the wafer, the stored location information on the alignment marks and based on the coordinates of the alignment marks positions determined by the above described alignment units, the control means controls the positions of the above described rotary carrier and its angle of rotation at the above described first and second stations to stipulated values.

The objects of the invention are moreover achieved by the above described device for exposing the peripheral area of a wafer includes a unit for introducing the exposure light into the above described first and second exit parts for the exposure light which consists of a light source part, first fibers for introducing the light, second fibers for introducing the light, a holding part which keeps the light incidence ends of the above described first and second fibers at a fixed distance to one another, and of a drive device for the holding part which drives the above described holding part. The light exit ends of the above described first and second fibers for introducing the light each are connected to the above described first and second exit parts for the exposure light. In the case of emitting the exposure light from the above described first exit part by means of the drive device for the holding part, the drive device is driven such that the light incidence end of the above described first fibers is positioned in the optical path of the emission from the above described light source part. Also, in the case of emitting exposure light from the above described second exit part by means of the drive device for the holding part, the drive device is driven such that the light incidence end of the above described second fibers for introducing light is positioned in the optical path of the emission from the above described light source part.

According to the invention, some of the peripheral area of the wafer can be exposed in a step shape and the remainder can be exposed in a ring-shape without determining the placed state of the wafer twice, because the peripheral area of the wafer is exposed in the above described manner. Therefore, the peripheral area of the wafer can be exposed with few working processes and high efficiency.

According to the invention, two exposure devices, i.e., one exposure device for step-shaped exposure of the peripheral area of the wafer and one exposure device for ring-shaped exposure of the peripheral area, need not be made available, and step-shaped exposure and ring-shaped exposure of the peripheral area of the wafer can be done using a single device without transporting the wafer between two devices, or without determining the placed state of the wafer twice.

According to the invention, furthermore by executing exposure at two stations, the device can be inherently produced at low cost because the control system does not become as large as in a device executing exposure at one station.

Moreover, only one light source part, for purposes of exposure, need be used and, thus, the device can be made smaller and, furthermore, the cost can be reduced.

These and further objects, features and advantages of the present invention will become apparent from the following description when taken in connection with the accompanying drawings which, for purposes of illustration only, show several embodiments in accordance with the present invention.

BRIEF DESCRIPTION OF THE DRAWINGS

FIG. 11 shows a schematic of actuation of the device for exposing the peripheral area of the wafer according to the embodiment according to the invention;

FIG. 12 shows a schematic of actuation of the device for exposing the peripheral area of the wafer according to the invention;

DETAILED DESCRIPTION OF THE PREFERRED EMBODIMENTS

Figure 1:
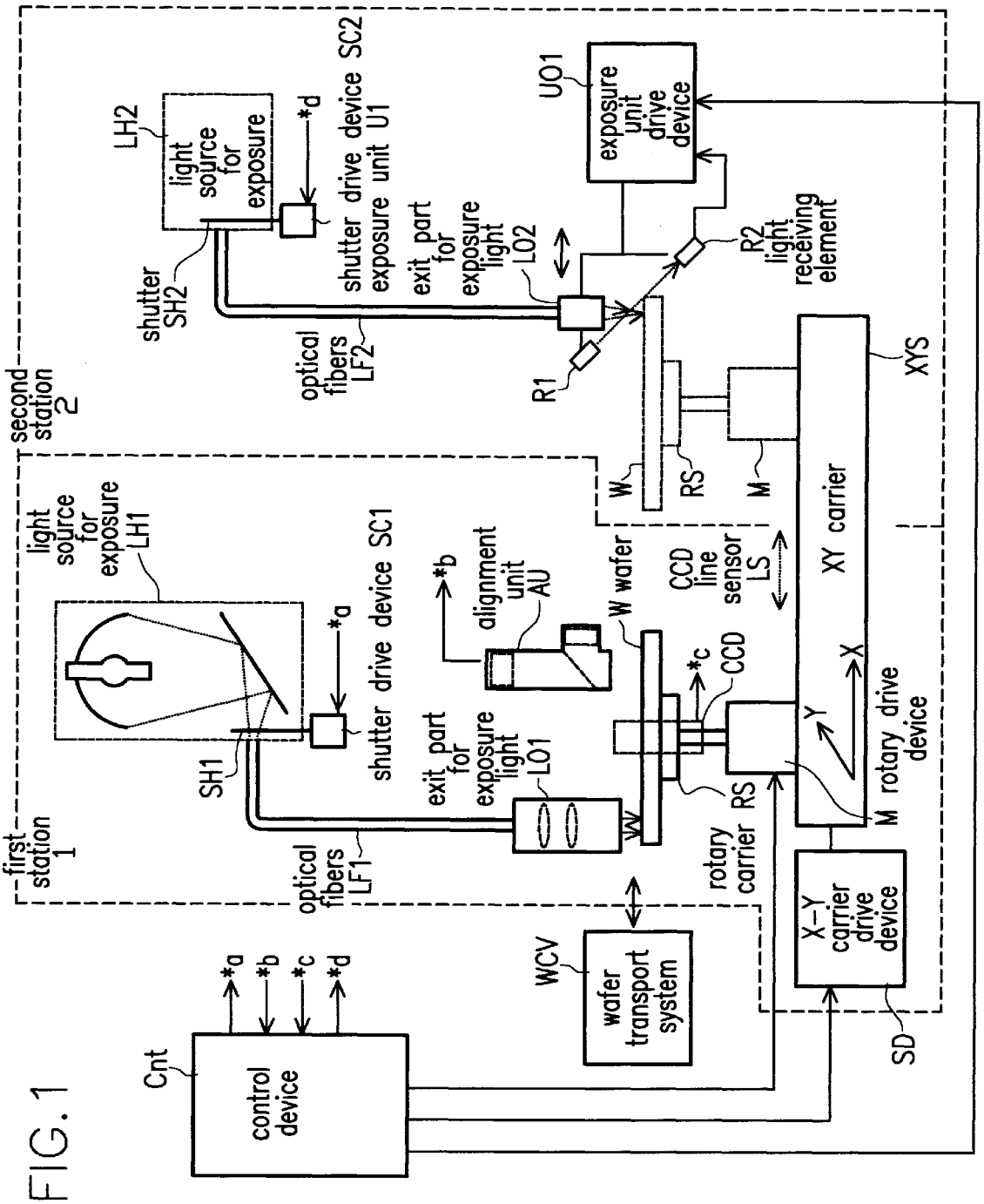
FIG. 1 shows a schematic of one embodiment of the arrangement of a device according to the invention for exposure of the peripheral area of the wafer.

FIG. 1 is a schematic of one embodiment of the arrangement of the device according to the invention for exposing the peripheral area of a wafer. Reference letters RS indicate a rotary carrier on which wafer W is placed and attached by means of a vacuum chuck or the like which is transported by means of a wafer transport system WCV.

Figure 2A:
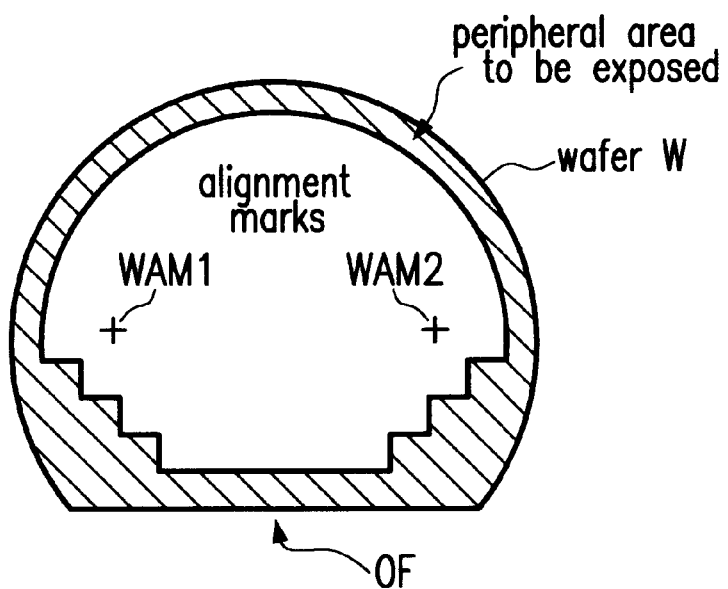
FIG. 2 shows a schematic of a wafer area to be exposed and of alignment marks.
Figure 2B:
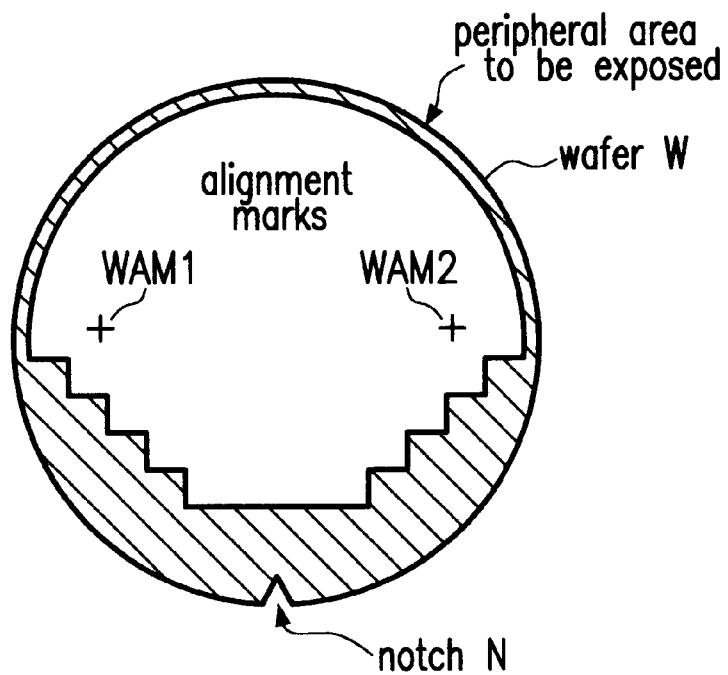

FIG. 2 is a schematic of an area of wafer W to be exposed and of alignment marks. Wafer W, as shown in FIGS. 2(a) and (b), includes a peripheral edge form such as an orientation flat OF which shows the crystal direction of wafer W, and which is hereafter called "ori-fla", or a peripheral edge form "notch" N. The circuit pattern is formed such that the above described "ori-fla" or above described "notch" N is assumed. Exposure is therefore fundamentally accomplished by proceeding from the above described "ori-fla" OF or above described "notch" N, even if the peripheral area of wafer W is exposed in a step-shape.

Furthermore, alignment marks WAM1, WAM2 for executing accurate positioning are recorded on wafer W, as is described below. In the following, mainly exposure of the peripheral area of wafer W is described which is provided with ori-fla OF as in FIG. 2(a). However, with respect to wafer W shown in FIG. 2(b), exposure of the peripheral area can also be done in the same way.

In FIG. 1, reference letter M indicates a rotary drive device for rotating rotary carrier RS which is installed on an X-Y carrier XYS which moves in X-Y directions (X: for example, to the right and left in the drawing; Y: for example, to the front and rear in the drawing). If X-Y carrier XYS is driven by an X-Y carrier drive device SD, above described rotary carrier RS moves together with above described rotary drive device M in the X-Y directions. X-Y carrier XYS and X-Y carrier drive device SD can furthermore be made integral with one another.

When rotary carrier RS is located at the position shown in the drawing by the solid line, i.e., at a first station, wafer W is irradiated with exposure light and the peripheral area of wafer W is exposed in a step-shape by moving rotary carrier RS in X-Y directions, as is described below. When step-shaped exposure is completed, rotary carrier RS is moved to the position in the drawing shown by the broken line and is located at a second station. During rotation of rotary carrier RS, wafer W is irradiated with exposure light and the peripheral area of wafer W is exposed in a ring-shape.

Furthermore, reference letters LH1 indicate a first light source for purposes of exposure which is located at the first station, and which consists of a lamp for emission of ultraviolet rays, a focussing mirror, a condenser lens, a filter and a shutter SH1 or the like. Shutter SH1 is driven by shutter drive device SC1. The exposure light which is emitted by the light source LH1 is introduced via optical fibers LF1 into an exit part LO1 for the exposure light if shutter SH1 is open. The peripheral area of wafer W is, as described below, exposed in a step-shape by the exposure light which is emitted from exit part LO1.

Figure 3A:
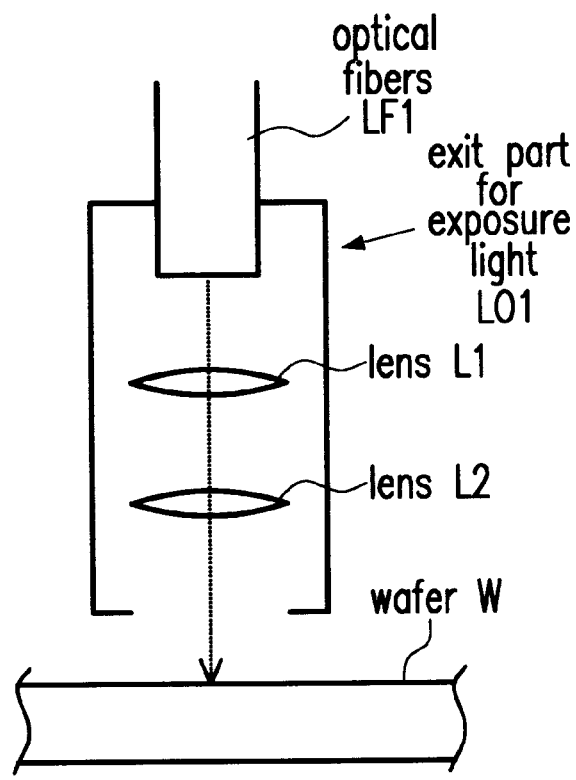
FIG. 3 shows a schematic of one arrangement of the first exit part for the exposure light.

FIG. 3 is a schematic of one example of the arrangement of exit part LO1 which has lenses L1, L2 as is illustrated in FIG. 3(a), and in which the light radiated from optical fibers LF1 is focussed by lenses L1, L2 and radiated onto wafer W. The irradiation area of exit part LO1 has a shape similar to that of one face of optical fibers LF1.

Figure 3B:
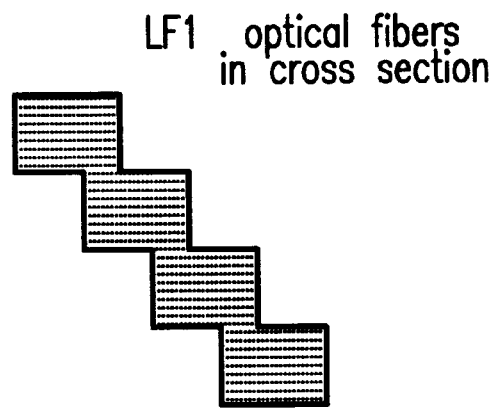

FIG. 3(b) is a schematic of the shape of the face of optical fibers LF1 which deliver the exposure light to exit part LO1. Optical fibers LF1 are, as is shown in the drawing, located in a direction obliquely inclined at an angle of 45°. The irradiation area of exit part LO1 for the exposure light, therefore, also has the shape shown in FIG. 3(b).

By means of the above described shape of the irradiation area of exit part LO1, step-shaped exposure, with a uniform amount of exposure, can be performed. Furthermore, the area can be widened which can be treated by scanning, and thus the irradiation time shortened (as detailed in Japanese patent application HEI 6-259798). FIG. 1 also illustrates an alignment unit AU which positions wafer W, as described below.

Figure 4:
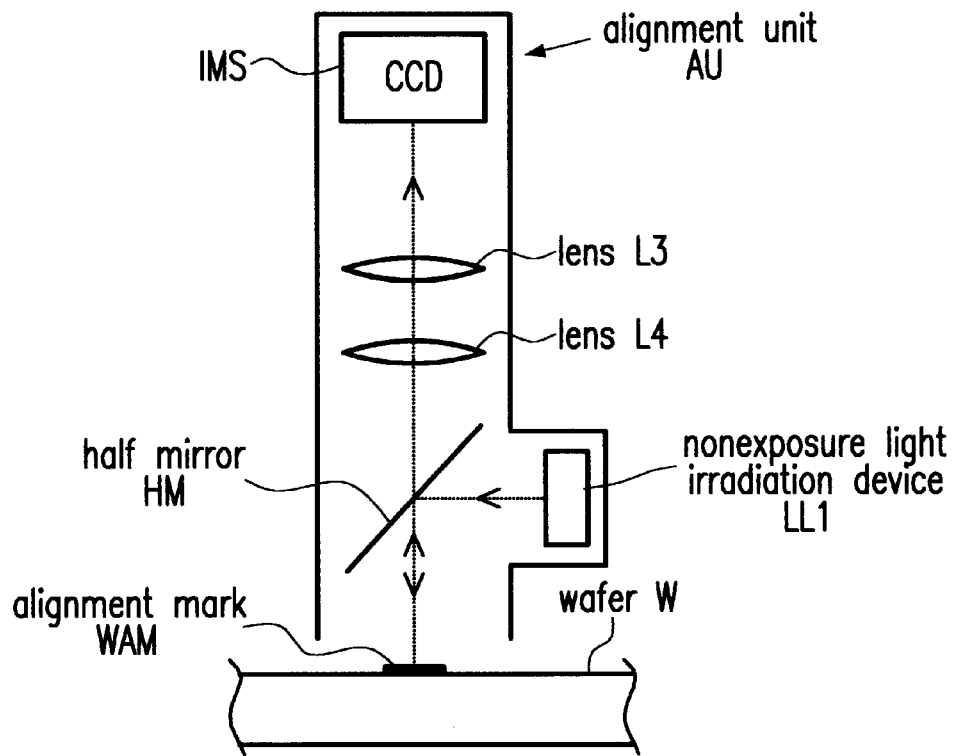
FIG. 4 shows a schematic of one arrangement of an alignment unit.

FIG. 4 shows a schematic of one example of the arrangement of alignment unit AU which consists of nonexposure light irradiation device LL1 for emitting nonexposure light, half mirror HM, lenses L3 and L4, and image recording element IMS, such as a CCD or the like, as is shown in the drawing. The nonexposure light emitted from nonexposure light irradiation device LL1 is emitted via half mirror HM onto wafer W, with reflected light which is picked up via half mirror HM, lens L4 and lens L3 by image recording element IMS.

Figure 5:
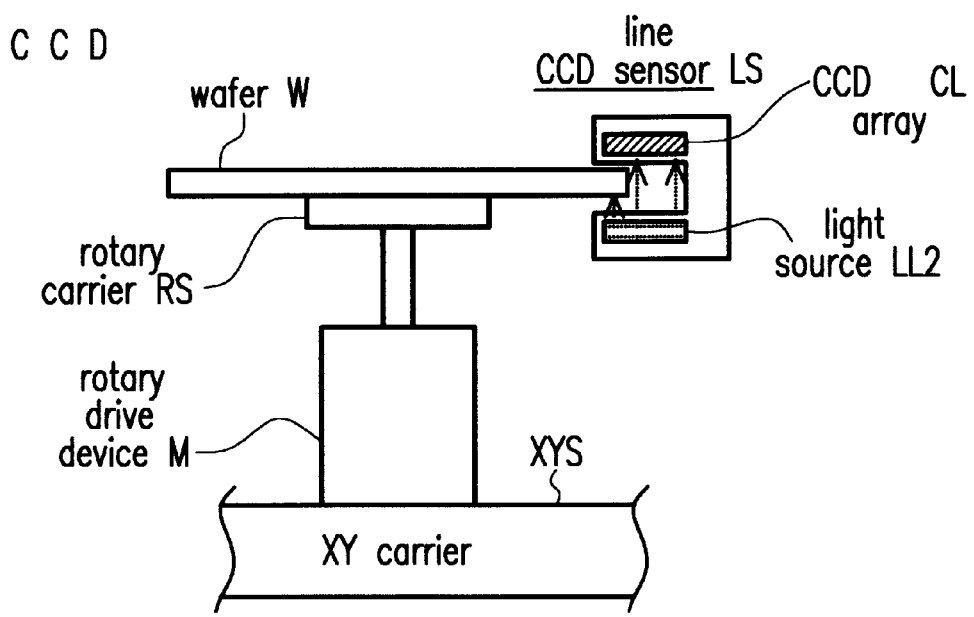
FIG. 5 shows a schematic of one arrangement of a CCD line sensor.

Referring to FIG. 1, a CCD line sensor LS consists of light source LL2 for emitting parallel nonexposure light and a CCD array CL for picking up the light emitted from light source LL2, as is illustrated in FIG. 5. The light emitted from light source LL2 is partially screened by one edge part of wafer W and the light which passes through the outside of the edge part is picked up by CCD array CL. This means that, depending on which pixel of CCD array CL has emitted light, the position of the edge of wafer W can be determined.

Therefore, by observing the initial changes of the CCD array in the rotation of wafer W, the position of the "ori-fla" OF of wafer W (or the position of "notch" N) and the amount of deviation of the center of wafer W from the center of rotation of rotary carrier RS can be determined. For computation of the above described amount of deviation, for example, the process disclosed in JP patent disclosure document HEI 3-108315 (U.S. Pat. No. 5,168,021) can be used.

As shown in FIG. 1, a second light source LH2 for purposes of exposure is provided which has the same arrangement as the above described first light source LH1 and which is located at the second station. The exposure light emitted from light source LH2 is introduced via optical fibers LF2 into exit part LO2 when shutter SH2 is open. Shutter SH2 is driven by a shutter drive device SC2. The peripheral area of wafer W is, as described below, exposed in a ring-shape by the exposure light which is emitted from exit part LO2.

Furthermore, an emission element R1 is provided and a light receiving element R2 is provided for picking up the light emitted from emission element R1. Emission element R1 and light receiving element R2 determine the edge part of wafer W. Exit part LO2 for the exposure light is, as is described below, installed on a moving body in which emission element R1 and light receiving element R2 are installed, and moves together with the above described moving body when it moves.

Exit part LO2, emission element R1 and light receiving element R2 form exposure unit U1 which is driven by exposure light drive device UD1 in the direction of the arrow of the drawing, by which control is effected such that, with the exposure light emerging from exit part LO2, a stipulated area of the peripheral area of wafer W is always irradiated.

As a result, the amount of light picked up by light receiving element R2 is fed back to exposure unit drive device UD1 which controls the position of exposure unit U1 such that the amount of light picked up by light receiving element R2 becomes constant. For this reason, exposure unit U1 moves according to the edge position of wafer W in the direction of the arrow in the drawing, even if wafer W rotates and its edge position changes. Exit part LO2 always maintains a stipulated positional relationship to the edge of wafer W. Actuation of above described exposure unit U1 is detailed, for example, in Japanese patent disclosure document HEI 2-1114 (U.S. Pat. No. 4,899,195).

Furthermore, a control device Cnt is provided into which the outputs of alignment units AU and CCD line sensor LS, are input. Control device Cnt controls, with stipulated sequences, shutter drive devices SC1, SC2, rotary drive device M, X-Y carrier drive device SD and exposure unit drive device UD1, by which exposure of the peripheral area of wafer W is accomplished.

Figure 6A:
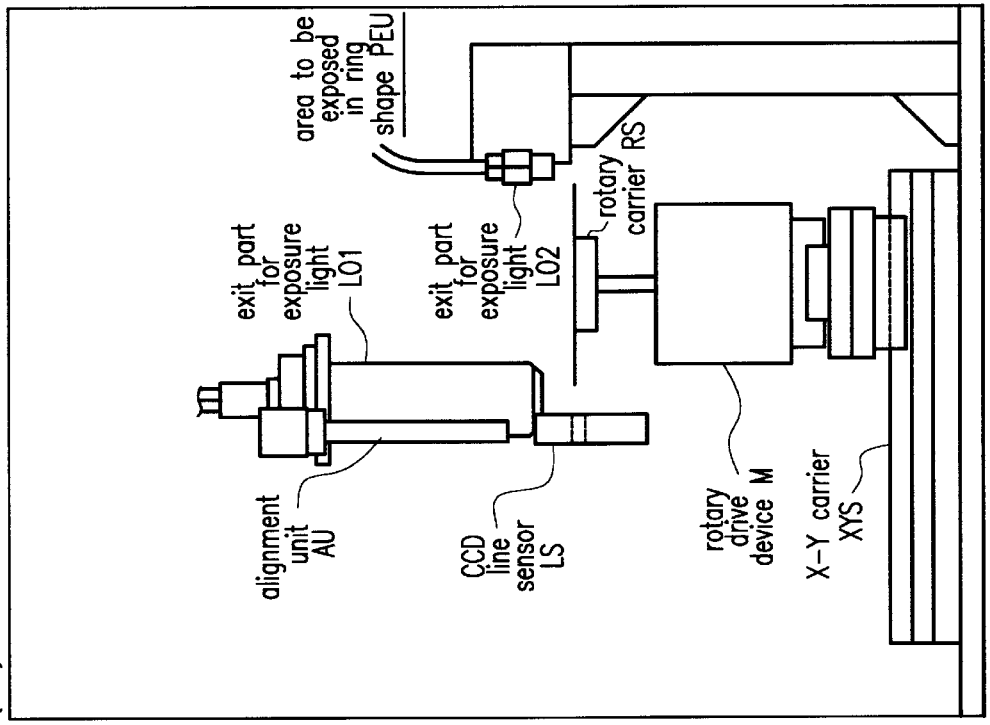
FIG. 6 shows a side view and a front view of the embodiment of the device according to the invention for exposure of the peripheral area of the wafer.
Figure 6B:
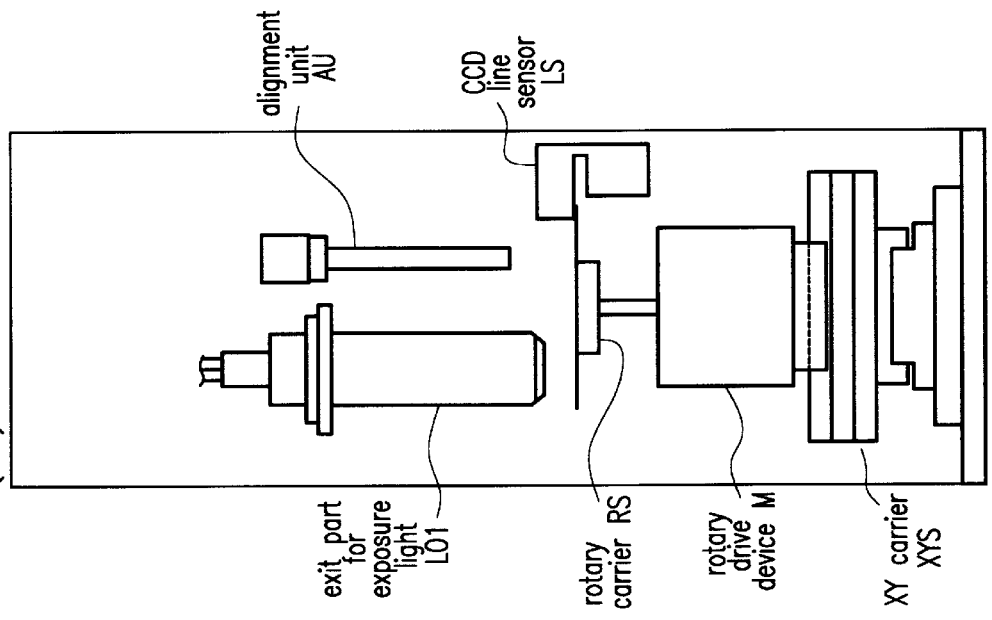
Figure 7:
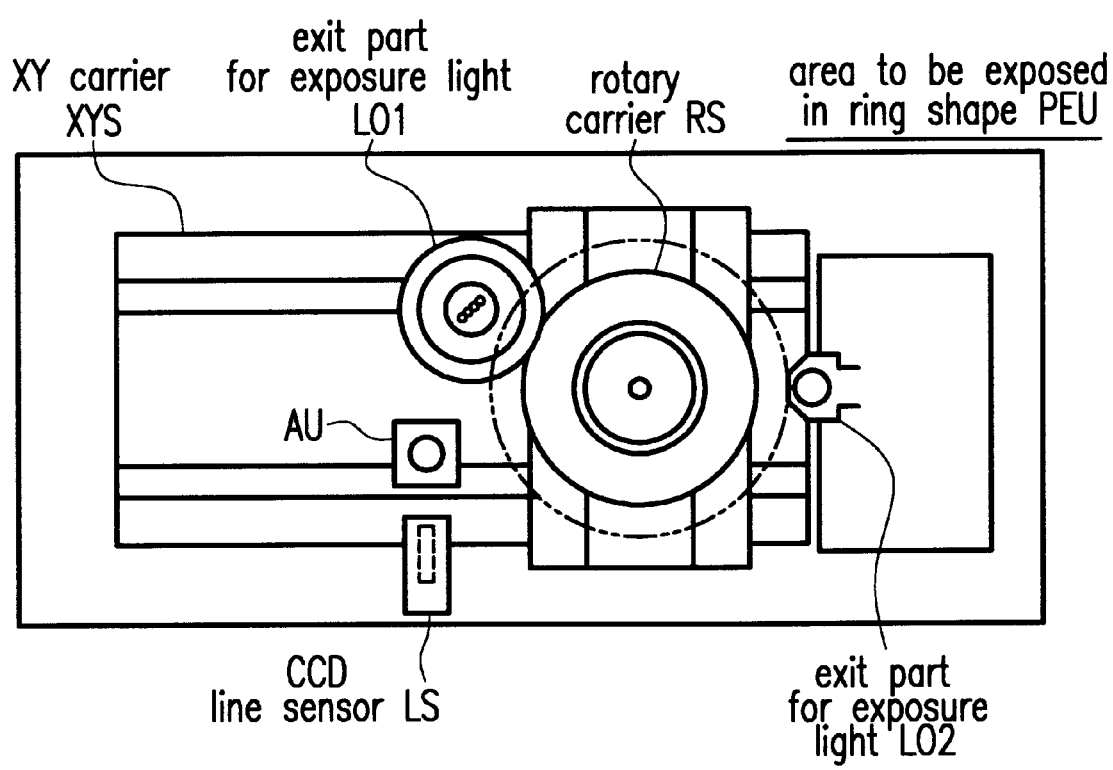
FIG. 7 shows an overhead view of an embodiment of the device according to the invention for exposing the peripheral area of the wafer.
Figure 8:
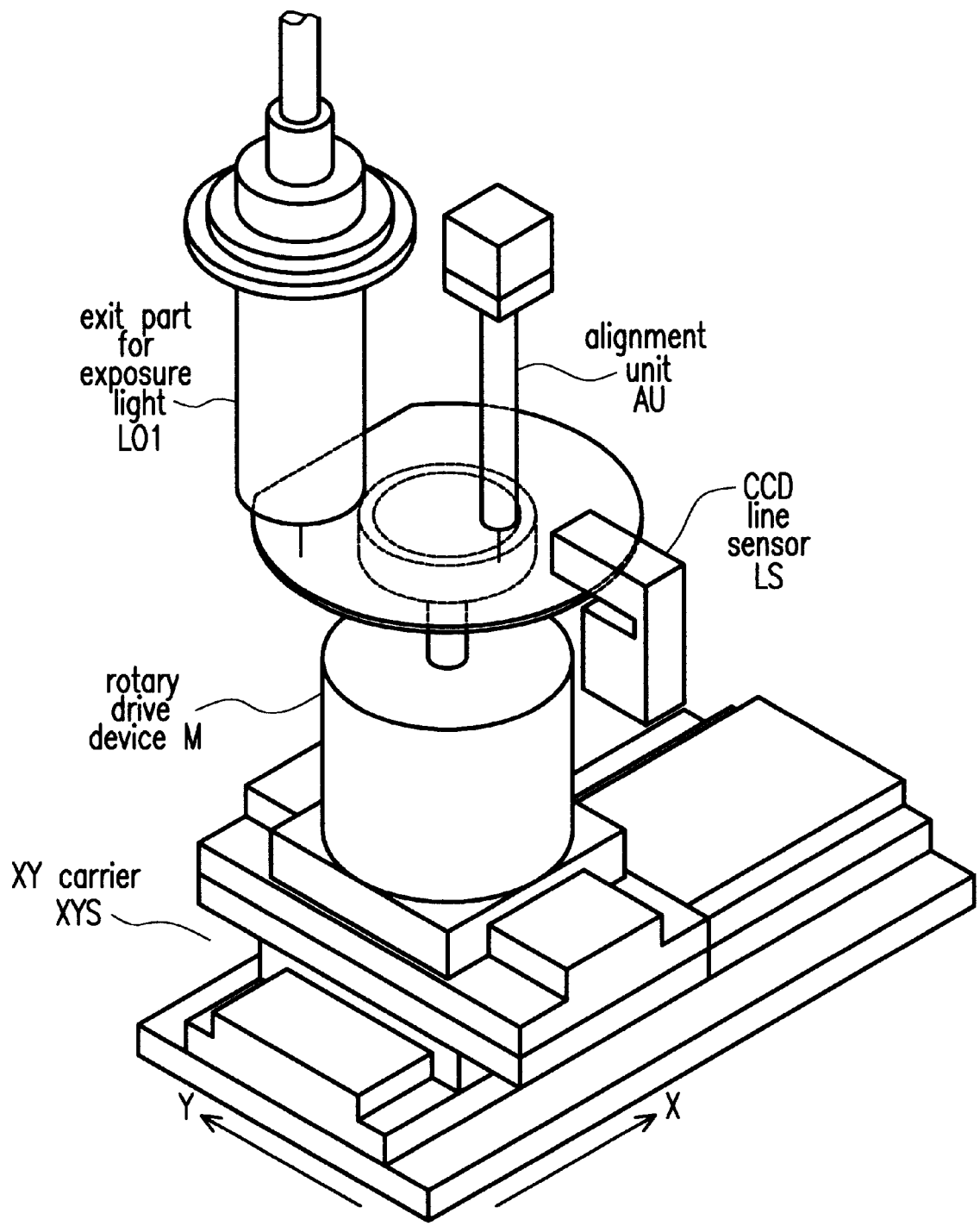
FIG. 8 shows a schematic of the arrangement for step-shaped exposure of the peripheral area of the wafer.
Figure 9:
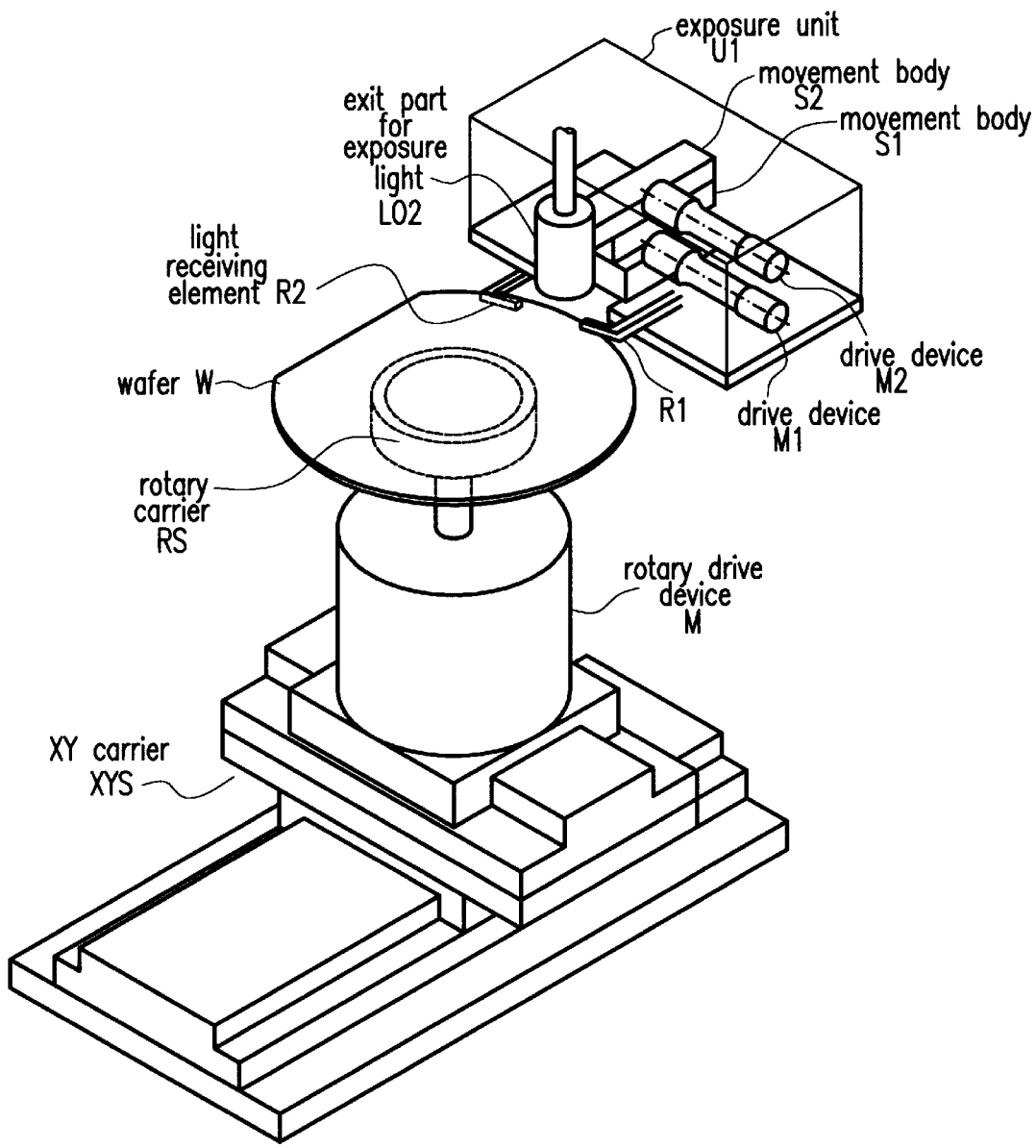
FIG. 9 shows a schematic of the arrangement for ring-shaped exposure of the peripheral area of the wafer.

FIGS. 6 through 9 schematically show the arrangement of the above described device for exposing the peripheral area of the wafer. FIGS. 6 and 7 are schematic views of this embodiment of the overall arrangement of the device for exposing the peripheral area of the wafer. FIG. 8 schematically shows a state in which the peripheral area of wafer W is exposed in a step shape at the first station. FIG. 9 schematically shows a state in which the peripheral area of the wafer is exposed in a ring shape at the second station. The same parts as in FIG. 1 are provided with the same reference numbers.

FIG. 6(a) shows a side view of this embodiment of the device for exposing the peripheral area of the wafer, while FIG. 6(b) is a front view and FIG. 7 is an overhead view. FIGS. 6 and 7 show states in which rotary carrier RS is located at the site shown in FIG. 1 by the broken line (that is, in which the peripheral area of the wafer is exposed in a ring shape).

Referring to FIGS. 6 and 7, first exit part LO1, alignment units AU and CCD line sensor LS are installed and located as shown in the drawing to have adjustable positions in a frame (not shown). Rotary drive device M is installed on X-Y carrier XYS and moves to the right and left in FIG. 6(a) and FIG. 6(b). Furthermore, a state is shown using a double dot-dash line in which wafer W is placed on rotary carrier RS. Also, an area PEU is shown which is to be exposed in a ring shape and which contains the exposure unit U1 provided with exit end LO2 and which is attached to the bottom.

FIG. 8 shows schematically the positional relationship between rotary carrier RS and first exit part LO1, when the peripheral area of wafer W is exposed in a step shape at the first station. The same parts as in FIGS. 1, 6 and 7 are provided with the same reference numbers. During step-shaped exposure of the peripheral area of the wafer, rotation of rotary carrier RS is stopped and the exposure light is radiated from exit part LO1 onto the peripheral area of wafer W by moving wafer W by means of X-Y carrier XYS in the X-Y directions.

Figure 10A:
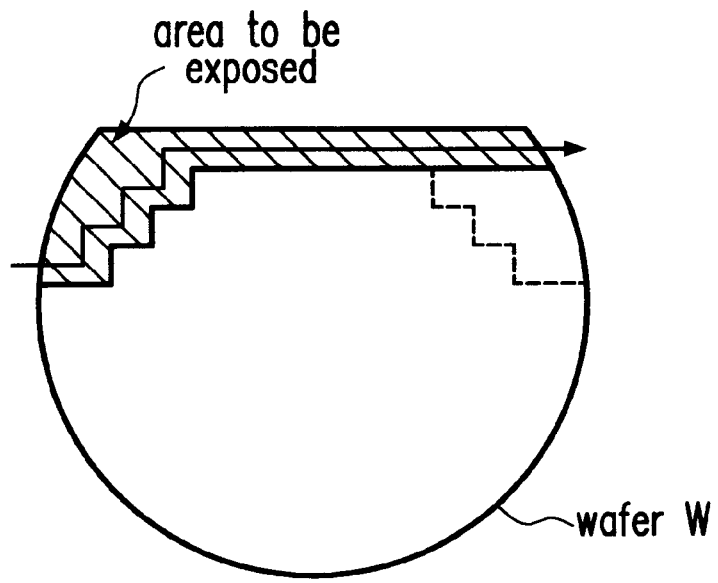
FIG. 10 shows a schematic of one example of the sequence in the step-shaped exposure of the peripheral area of the wafer.
Figure 10B:
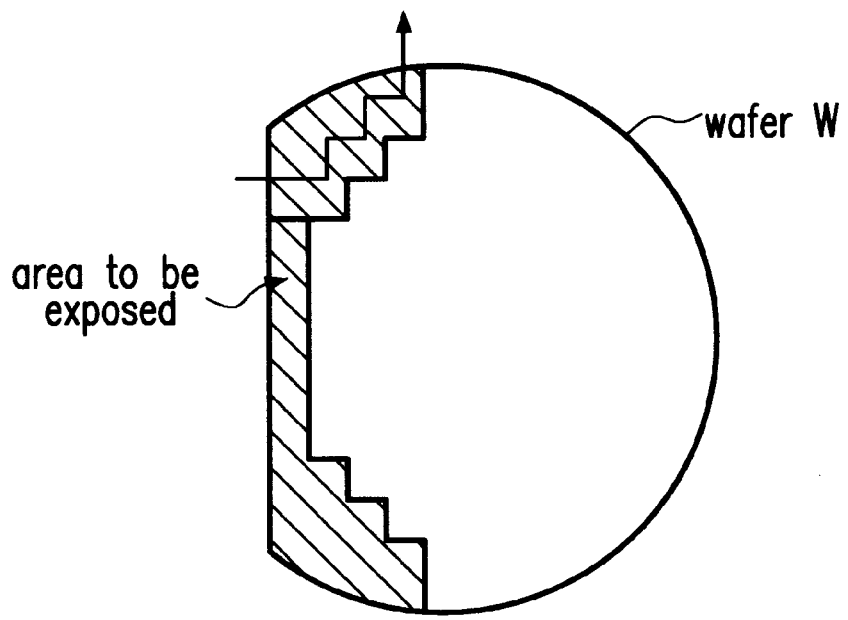

FIG. 10 is a schematic of one example of the sequence in the step-shaped exposure of the peripheral area of wafer W. As illustrated in FIG. 10, wafer W is moved by means of X-Y carrier XYS in the X-Y directions. As a result, the area shown in FIG. 10(a) is exposed first. Next, wafer W is rotated by 90 degrees and the area shown in FIG. 10(b) is exposed in the same way.

FIG. 9 schematically shows the relative position of rotary carrier RS and area PEU to be exposed in a ring shape for ring-shaped exposure of the peripheral area of wafer W at the second station. In FIG. 9, the same parts as in FIGS. 1, 6 and 7 are provided with the same reference numbers and the arrangement of exposure unit U1, which is located in area PEU to be exposed in a ring shape, is shown.

Exposure unit U1 includes of first movement body S1 in which emission element R1 and light receiving element R2 are installed, and which moves in the radial direction of wafer W. Exposure unit U1 further includes a second movement body S2 in which second exit part LO2 is installed, and which is installed on movement body S1 to move in the radial direction of wafer W. In addition, exposure unit U1 includes a first drive device M1 and a second drive device M2 which each drive movement bodies S1 and S2.

The position of second movement body S2 with respect to first movement body S1 is kept constant at a stipulated value. The relative position of exit part LO2 is fixed with respect to emission element R1 and light receiving element R2. By means of this relative position, the exposure width of the peripheral area of wafer W (one exposure length in the radial direction of the wafer) can be established.

Furthermore, based on the output of light receiving element R2, which is installed in first movement body S1, exposure unit drive device UD1 controls the position of first movement body S1 such that the edge of wafer W is matched, as described above.

Referring to FIG. 9, when the peripheral area of wafer W is exposed, rotary carrier RS stops at the site shown in the drawing and rotary carrier RS is rotated by means of rotary drive device M, by which wafer W rotates. During rotation of wafer W, exposure unit drive device UD1, based on the output of light receiving element R2, controls the position of first movement body S1, as was described above, by which the location irradiated with the exposure light corresponds to the edge of wafer W, that is, the exposure light irradiated from exit part LO2 which is located on second movement body S2. In this way, the peripheral area of wafer W is exposed with a stipulated exposure width.

FIGS. 11 and 12 are schematics of the actuation process of the device for exposing the peripheral area of a wafer according to this embodiment, as follows:

(1) X-Y carrier drive device SD drives X-Y carrier XYS. Rotary carrier RS is moved to the site shown in FIG. 11(a) and picks up wafer W which has been transported by wafer transport system WCV shown in FIG. 1. Wafer W is placed at a stipulated site on rotary carrier RS and attached by means of a vacuum chuck or the like. The position of wafer W in the above described transport furthermore has few variances, by which the center of wafer W and the center of rotation of rotary carrier RS do not always agree with one another, but small deviations from one another occur.

(2) X-Y carrier drive device SD drives X-Y carrier XYS. Rotary carrier RS is moved to the site shown in FIG. 11(b) on the first station, and wafer W is rotated once. During rotation of wafer W, the position of the edge of wafer W is determined by means of CCD line sensor LS. The information about the edge position of wafer W which was determined by CCD line sensor LS is sent to control device Cnt, shown in FIG. 1, and stored in a memory located in control device Cnt. Control device Cnt, based on the edge position information of wafer W which was stored in the above described memory, determines the amount of deviation of the center of wafer W from the center of rotation of rotary carrier RS, which is hereafter called "eccentricity". Furthermore, it determines and stores the position of "ori-fla" OF (or of "notch" N) of wafer W.

(3) Based on the above computed data, rotary carrier RS is rotated by driving rotary drive device M until the "ori-fla" becomes parallel to the X axis of the x-y coordinate system shown in FIG. 11. Furthermore, in the case of the arrangement of a "notch" in the wafer W, rotary carrier RS is rotated until a straight line, which is formed between notch N and the center of wafer W, becomes parallel to the Y axis.

As was described above, in step-shaped exposure of the peripheral area of wafer W, exposure is accomplished such that it proceeds from above described "ori-fla" OF or above described "notch" N. The reason for this is that the pattern is formed at a stipulated site with respect to "ori-fla" OF or "notch" N. The positional relationship between the site at which the above described pattern is formed and "ori-fla" OF or "notch" N, can however have errors, depending on the accuracy in a preceding process performed prior to the process of this exposure of the peripheral area of the wafer, i.e., in a process in which the pattern is formed. To achieve step-shaped exposure with high precision, therefore, alignment is done using alignment marks WAM1, WAM2, shown in FIG. 2, which have a stipulated positional relationship to the pattern.

(4) Control device Cnt, based on the above described eccentricity and the position information about alignment mark WAM1 (see FIG. 2) on wafer W which was stored beforehand in control device Cnt, determines the amount of movement of rotary carrier RS and moves the carrier by means of X-Y carrier drive device SD so that alignment mark WAM1, recorded on wafer W (see FIG. 2), projects into the visual field of alignment unit AU, as is shown in FIG. 11(c) with a solid line. The above described errors of the site at which the pattern is formed are not large to the degree in which the alignment marks are located outside of the visual field. This means that the angular direction is already corrected in above described step (3), which is necessary for alignment mark WAM1 to extend into the visual field of the alignment unit AU.

(5) Nonexposure light is radiated from nonexposure light irradiation device LL1 (see FIG. 4) of alignment unit AU. The position coordinates of alignment mark WAM1 are determined and stored using an image recording element IMS.

(6) Next, control device Cnt, by means of X-Y carrier drive device SD, moves rotary carrier RS by an amount in the X-direction which corresponds to the distance between alignment mark WAM1 and alignment mark WAM2 so that alignment mark WAM2, recorded on wafer W, extends into the visual field of alignment unit AU, as is shown in FIG. 11(c) by a dot-dash line. Then nonexposure light is radiated from nonexposure light irradiation device LL1 (see FIG. 4) of alignment unit AU and the position coordinates of alignment mark WAM2 are determined and stored by image recording element IMS.

(7) Based on the above determined position coordinates of alignment marks WAM1, WAM2 and the stored position information about the two alignment marks, control device Cnt computes the amount of rotation and amount of motion of rotary carrier RS, rotates rotary carrier RS such that alignment marks WAM1, WAM2 on wafer W are positioned at sites fixed beforehand, drives X-Y carrier XYS and moves rotary carrier RS. Above described actuations (5) through (7) are repeated until the differences between the actual positions of alignment marks WAM1, WAM2 on wafer W and the fixed positions lie within stipulated values. When the differences are within the stipulated values, radiation of the nonexposure light from the above described nonexposure light irradiation device LL1 is stopped.

The process for the above described alignment may of the type described in Japanese patent application 7-276207 (U.S. patent application Ser. No. 08/725,020) in which, for example, a tilt angle between a segment which is formed between alignment mark WAM1 and alignment mark WAM2 and the X-axis, is determined. The rotary carrier RS is rotated such that above described tilt angle lies within a stipulated value, and for which the rotary carrier is moved.

(8) Control device Cnt, based on the above described eccentricity, computes the amount of motion of rotary carrier RS and moves rotary carrier RS such that the light emerging from exit part LO1 irradiates a site on wafer W at which step-shaped exposure begins, as shown in FIG. 12(d).

(9) Shutter SH1 (see FIG. 1) of light source LH1 is opened. Exit part LO1 emits exposure light onto the peripheral area of wafer W and step-shaped exposure is started. Rotary carrier RS is moved, for example, in the X-Y directions, as shown in FIG. 10, along the area which is to be exposed in a step-shape and which was stored beforehand in control device Cnt, by which the peripheral area of wafer W is exposed in a stepshaped manner. FIG. 12(e) shows the state of the above described step-shaped exposure. In the case in which the area is wide in which X-Y carrier XYS moves, or in the case in which the area to be exposed in a step shape is narrow, and in which exposure is enabled without rotating wafer W, exposure need not always be done after wafer W has been rotated 90 degrees at a time, as was described above.

(10) After completion of the above described step-shaped exposure, control device Cnt moves, by means of X-Y carrier drive device SD, rotary carrier RS from the first station to the location in FIG. 12(f) on the second station at which ring-shaped exposure is started. Control device Cnt rotates rotary carrier RS such that, with the light which emerges from exit part LO2 and in which ring-shaped exposure is done, the location of wafer W is irradiated at which ring-shaped exposure is started. The location at which ring-shaped exposure is started, is stored beforehand in control device Cnt (for example, the angle of rotation between the singular point such as "ori-fla" OF, "notch" N or the like and a point in which ring-shaped exposure begins, and the like). Control device Cnt corrects the above described stored angle of rotation based on the eccentricity determined above in step (2), computes the amount of rotation of wafer W based on the corrected angle of rotation and rotates wafer W.

Figure 13A:
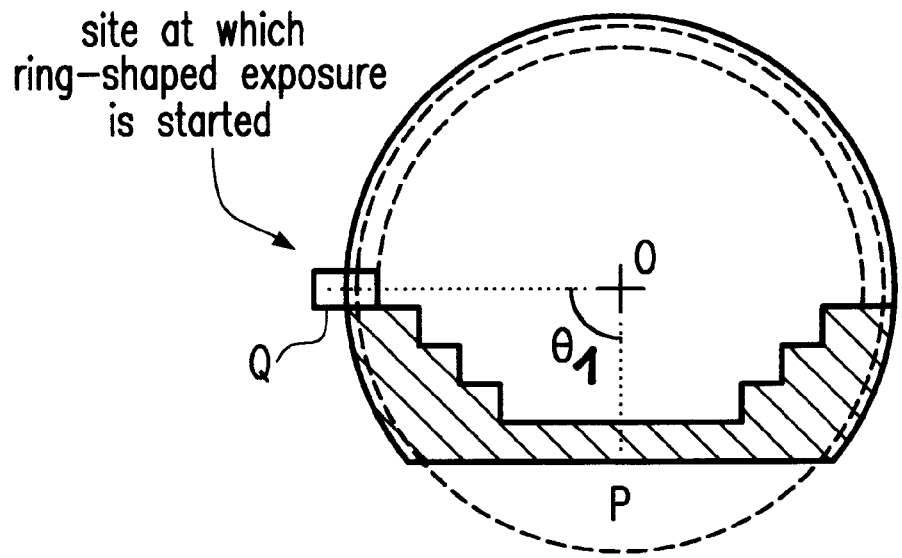
FIG. 13 shows a schematic of the relation between eccentricity and the angle of rotation of the wafer.
Figure 13B:
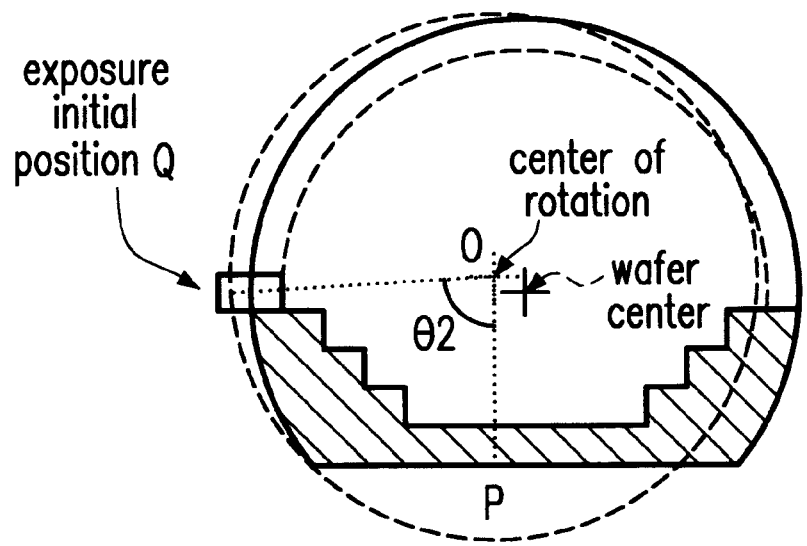

FIG. 13 is a schematic of the relation between the eccentricity and the angle of rotation. Reference letter O indicates the center of rotation of rotary carrier RS, reference letter P indicates the intersection by the perpendicular between the center of rotation O and "ori-fla" OF and by the "ori-fla", and reference letter Q indicates a point at which exposure is started. In FIG. 13(a) reference symbol $\Theta 1$ indicates the angle between segment OP and segment OQ in the case in which the center of wafer W aligns with center of rotation O of rotary carrier RS. In FIG. 13(b) reference symbol $\Theta 2$ designates the angle between segment OP and segment OQ in the case in which the center of wafer W does not align with the center of rotation of rotary carrier RS.

As is apparent from FIG. 13(a) and FIG. 13(b), in the case of deviation of the center of wafer W from the center of rotation of rotary carrier RS the angle between point P and site Q at which exposure is begun, proceeding from point P, is $\Theta 2$, that is, a value which differs from angle $\Theta 1$ at which the center of wafer W aligns with the center of rotation.

In the case of deviation of the center of wafer W from the center of rotation of rotary carrier RS, it is necessary, based on eccentricity, to compute the difference between angle $\Theta 1$ and angle $\Theta 2$, i.e. $\Theta 1-\Theta 2$, and to correct the amount of rotation of wafer W as described hereinabove. The movement and rotation of rotary carrier RS from the first station to the second station can take place individually or at the same time. In the case of simultaneous execution, the duration of the transition of step-shaped exposure to ring-shaped exposure can be shortened, by which throughput is increased.

(11) Shutter SH2 (see FIG. 1) of light source LH2 is opened. Exit part LO2 emits exposure light onto the peripheral area of wafer W as it is rotated. In this way, ring-shaped exposure is performed. In doing so, exit part LO2, for the exposure light, moves according to the edge of wafer W in its radial direction and the peripheral area of wafer W is exposed with a stipulated exposure intensity, as was described above.

(12) After completion of ring-shaped exposure, shutter SH2 of the light source LH2 is closed. By means of X-Y carrier drive device SD, X-Y carrier XYS is driven and rotary carrier RS is moved and removed to the site shown above in FIG. 11(a). Wafer W is removed from rotary carrier RS by wafer transport systems WCV and transported to the next process.

In the above described embodiment, exposure of the entire periphery of wafer W is described. However, in the ring-shaped exposure of the peripheral area of wafer W by opening and closing of shutter SH2, only one part of the peripheral area of wafer W can be exposed.

Figure 14:
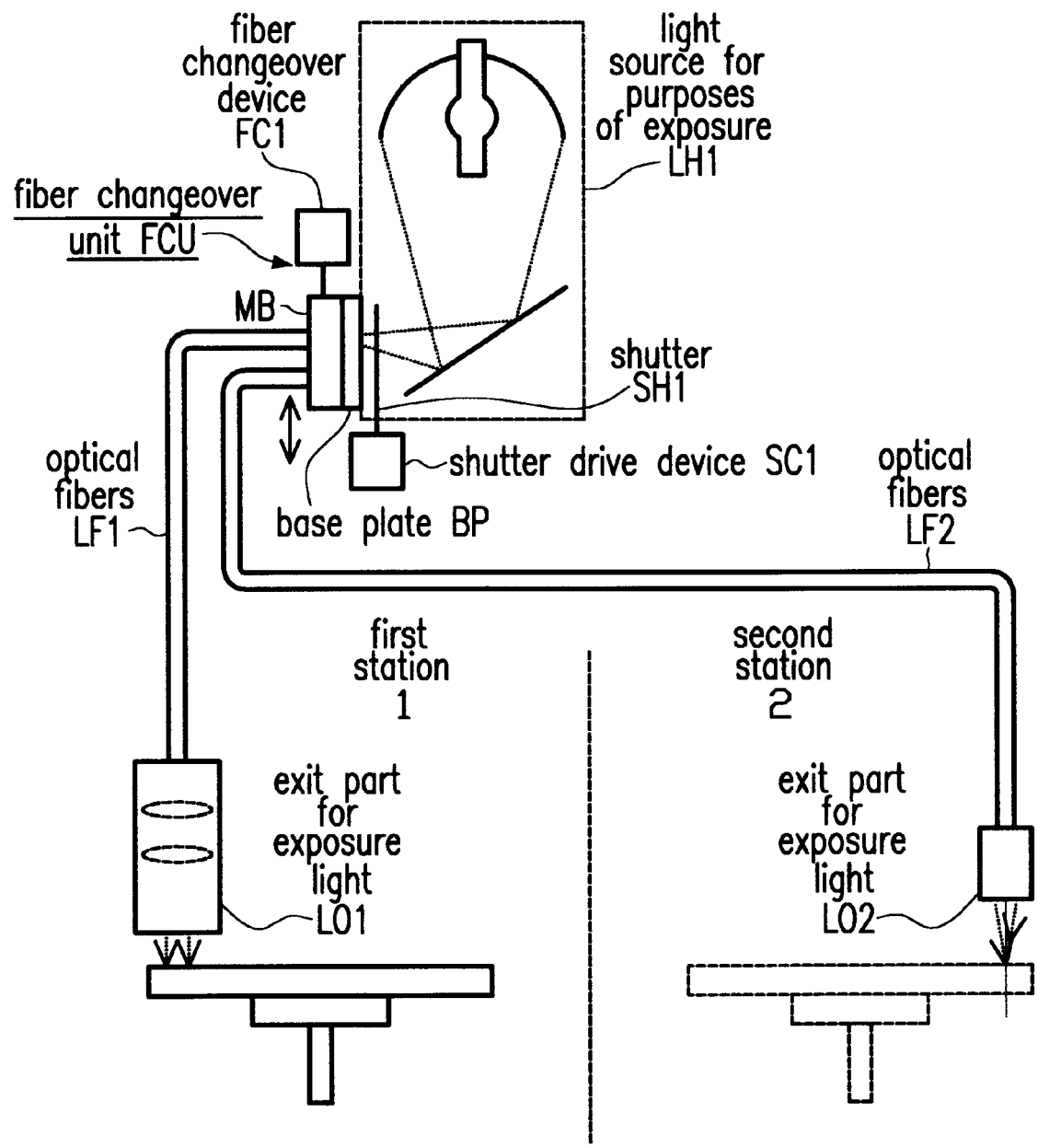
FIG. 14 shows a schematic of another embodiment of the invention.

FIG. 14 shows a schematic of another embodiment of the invention. In this embodiment, introducing the light from only one light source LH1 via optical fibers LF1, LF2 selectively into exit parts LO1, LO2 results in both step-shaped exposure and also ring-shaped exposure of the peripheral area of the wafer being accomplished.

In FIG. 14, reference symbol LH1 indicates the light source which has shutter SH1 and shutter drive device SC1, as was described above. Furthermore, reference letters BP indicate a base plate which is located in light source LH1, reference symbol FC1 indicates a fiber changeover device which consists, for example, of an air cylinder or the like, and reference letters MB indicate a movement plate which is arranged to move in base plate BP and which is driven by fiber changeover device FC1 to the top and bottom in the drawing.

Fiber changeover device FC1, movement plate MB and base plate BP form fiber changeover unit FCU in this embodiment. Furthermore, reference symbols LF1, LF2 indicate the optical fibers with one end each held by movement plate MB, and with the other ends each connected to exit part LO1, LO2. Other arrangements are identical to the arrangements shown above in FIG. 1, wherein the fiber changeover device FC1 is controlled by control device Cnt shown in FIG. 1.

Figure 15:
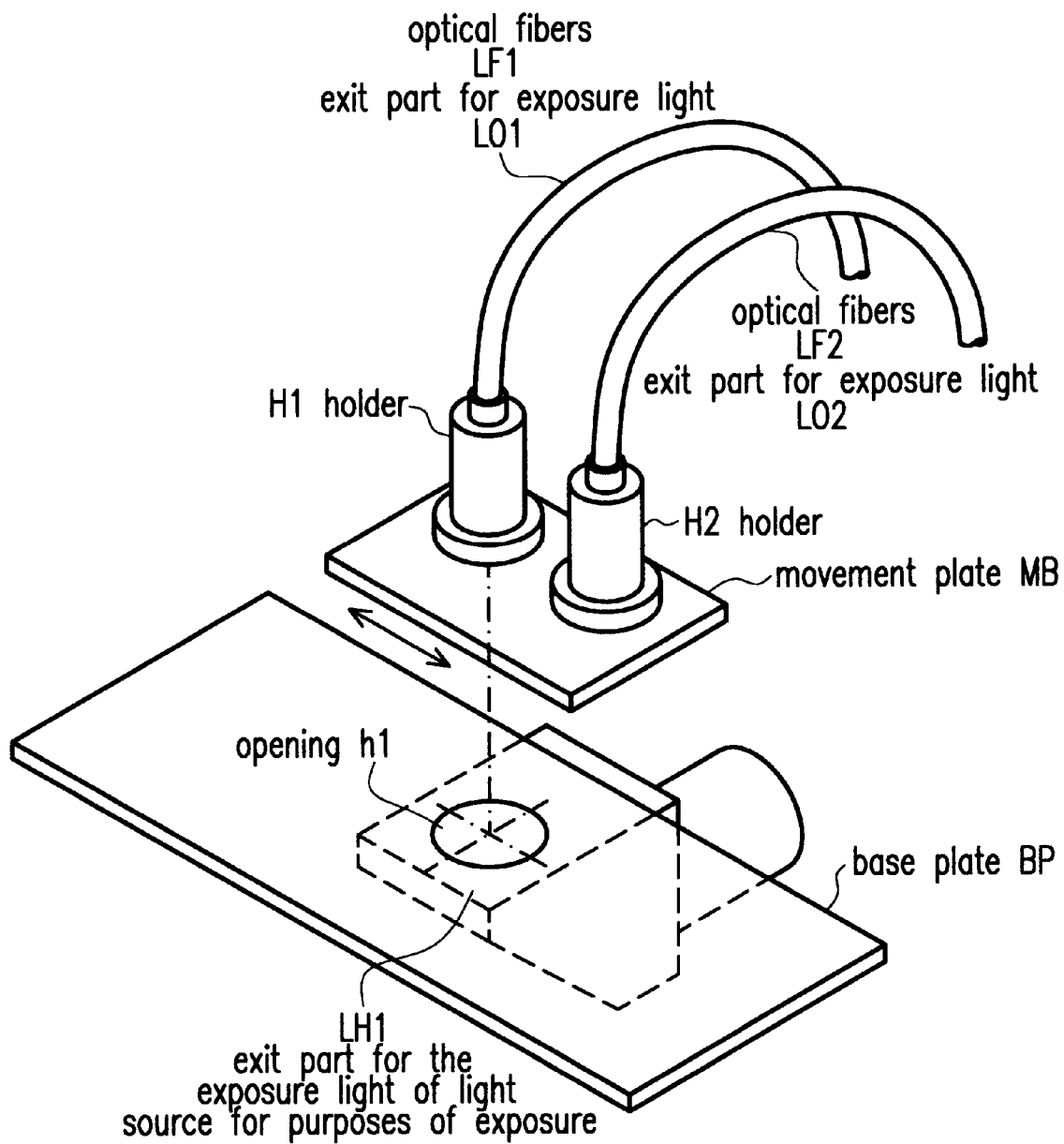
FIG. 15 shows a schematic of one example of the arrangement of a fiber changeover unit FCU.

FIG. 15 is a schematic of one example of the arrangement of fiber changeover unit FCU shown in FIG. 14. The same parts as in FIG. 14 are provided with the same reference numbers. As illustrated in FIG. 15, base plate BP, which is located in light source LH1, is provided with opening h1 via which exposure light emerges from light source LH1. Furthermore, movement plate MB is provided with holders H1, H2 into which one end of optical fibers LF1, LF2 are inserted and attached. Movement plate MB is driven by fiber changeover device FC1 in the direction of the arrow in the drawing.

Figure 16:
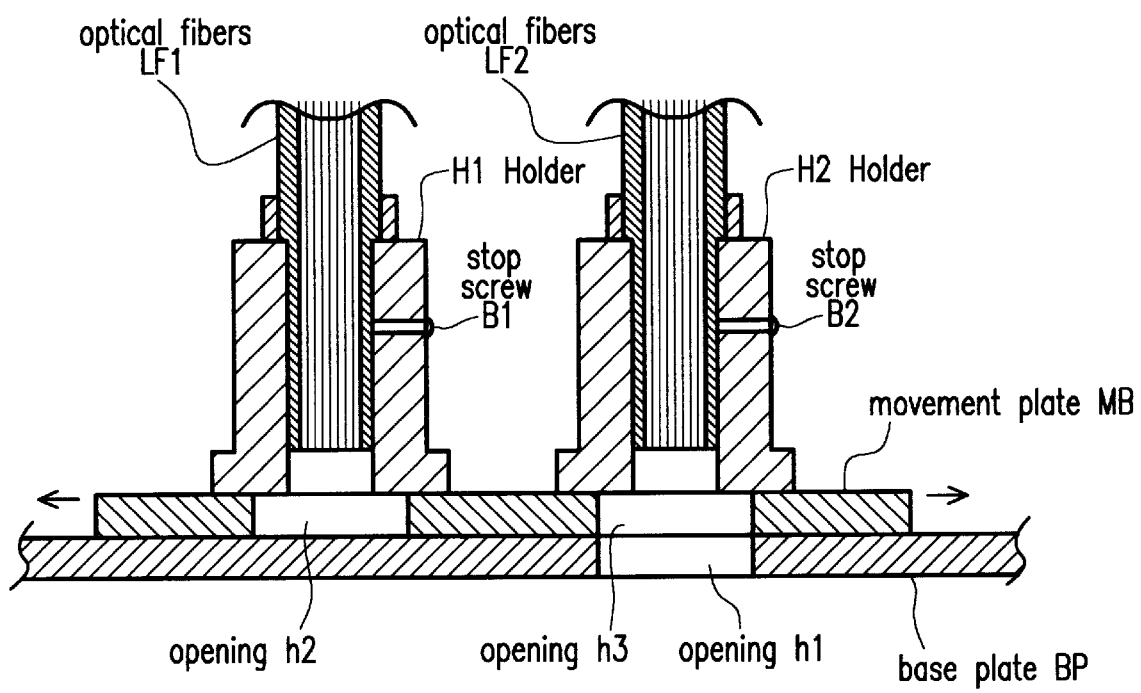
FIG. 16 shows a schematic of the arrangements in which optical fibers LF1, LF2 are installed in moving plate MB.
Figure 17A:
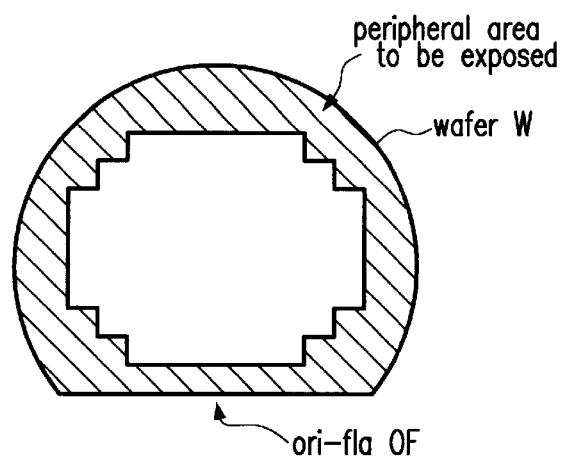
FIG. 17 shows a schematic of the peripheral area of a wafer to be exposed.
Figure 17B:
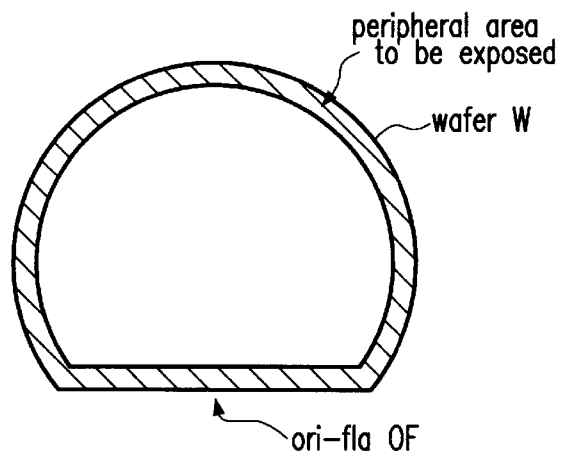
Figure 17C:
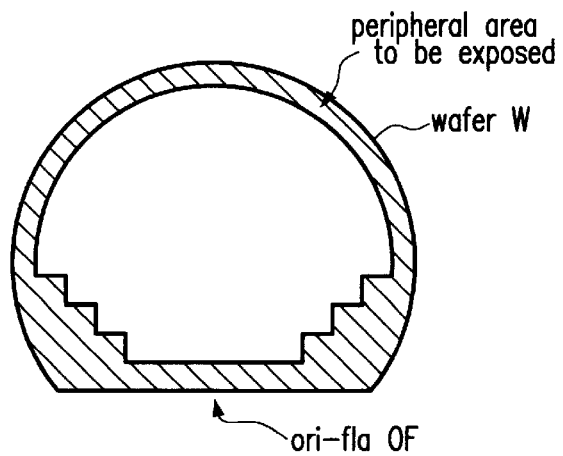

FIG. 16 is a schematic of the arrangements in which optical fibers LF1, LF2 are installed in movement plate MB. The arrangements of movement plate MB and holders H1, H2 in FIG. 15 are shown in cross section. As is apparent from the drawing, movement plate MB is provided with openings h2, h3 in which holders H1, H2 are installed which have through openings. The ends of optical fibers LF1, LF2 are inserted into holders H1, H2 and are attached, for example, with stop screws B1, B2.

Fiber changeover unit FCU, in this embodiment, has the above described arrangement. Fiber changeover device FC1 drives movement plate MB. When opening h1 of base plate BP aligns with opening h2 located on movement plate MB, the light radiated from the light source LH1 is incident, via openings h1, h2, onto optical fibers LF1 and the light incident onto optical fibers LF2 is shielded. If movement plate MB is driven, and if opening h1 of base plate BP aligns with opening h3, the light emitted from the light source LH1 is incident, via openings h1, h3, onto optical fibers LF2 and the light incident onto optical fibers LF1 is shielded.

In the following, the exposure of the peripheral area of the wafer using fiber changeover unit FCU in this embodiment is described. The sequences in the positioning of wafer W, step-shaped exposure, ring-shaped exposure and the like, are identical to sequences (1) through (12) described above. Primarily, actuation of fiber changeover unit FCU is described as follows:

(1) As was described above, wafer W to be exposed is placed on rotary carrier RS. X-Y carrier XYS is driven and rotary carrier RS is moved to the site on the first station at which step-shaped exposure is to be done.

(2) Movement plate MB is driven by fiber changeover device FC1 and moved to the point at which the exposure light emitted from light source LH1 is incident onto optical fibers LF1 (which are connected to exit part LO1).

(3) After positioning of wafer W, shutter SH1 of light source LH1 is opened. Exposure light is emitted from exit part LO1 and the peripheral area of wafer W is exposed in a step shape.

(4) After completion of exposure, shutter SH1 is closed. The radiation of exposure light from exit part LO1 is stopped.

(5) X-Y carrier XYS is then driven so as to move rotary carrier RS to the site on the second station at which ring-shaped exposure is to be done.

(6) Movement plate MB is driven by fiber changeover device FC1 and moved to the point at which the exposure light emitted from light source LH1 is incident onto optical fibers LF2 (which are connected to exit part LO2).

(7) Shutter SH1 of light source LH1 is opened. Exposure light is emitted from exit part LO1 and the peripheral area of wafer W is exposed in a ring shape.

(8) After completion of exposure, above described shutter SH1 is closed, and the radiation of exposure light from exit part LO2 is stopped.

After completion of exposure of the peripheral area of wafer W in the above described manner, rotary carrier RS is moved to the original position. Wafer W, having a peripheral area which has already been exposed, is removed from rotary carrier RS and transported to the next process.

As described hereinabove, in this embodiment, the arrangement of fiber changeover unit FCU and the introduction of light from one light source LH1 via optical fibers LF1, LF2 into exit parts LO1, LO2 selectively prevent the illumination intensity of the exposure light emerging from the exit parts, from decreasing, as in the case in which a single optical fiber is branched at one point and introduced into two exit parts LO1, LO2. This prevents the duration of wafer treatment from becoming long. Furthermore, it is unnecessary to increase the size of the light source for purposes of exposure.

Accordingly, the present invention results in the following desirable effects and advantages:

(1) Some of the peripheral area of the wafer can be exposed in a step shape and the remainder in a ring shape without having to twice determine the state in which the wafer is placed. This effect is achieved by the present process and device by which a semiconductor wafer to which a resist has been applied is placed on a rotary carrier positioned at a first station; the state in which wafer has been placed on the rotary carrier and the position of a singular point of the wafer are determined and stored; based on the determined and stored state in which the wafer is placed, based on the determined and stored singular point of the wafer and based on the stored position information about alignment marks the rotary carrier is moved/rotated such that the alignment marks are determined; the positions of the alignment marks recorded on the wafer are determined and stored; based on the determined and stored positions of the alignment marks, the rotary carrier is moved/rotated such that exposure light from the first exit part is radiated onto a first site on the wafer at which exposure is started; and, from the first exit part the wafer is radiated on the peripheral area by moving the rotary carrier parallel to the wafer surface and in orthogonally intersecting directions. As a result, part of the peripheral area of the wafer is exposed in step-shape. Furthermore, based on the determined and stored state in which the wafer is placed, and based on the determined and stored position of the singular point of the wafer, the rotary carrier is moved from the first station to the second station and at the same time rotated. The exposure light from a second exit part is radiated onto a second site in a not yet exposed part of the peripheral area of the wafer at which exposure is started. Then, at the second station, the rotary carrier is rotated. Next, from the second position at which exposure is started, the exposure light is radiated onto the not yet exposed part of the wafer, and by which thus the peripheral area of the wafer is exposed in a ring shape. Therefore, exposure of the peripheral area of the wafer can be done with few working processes and with high efficiency. In doing so, the motion and the rotation of the rotary carrier from the first station to the second station can be done individually or simultaneously. In the case of simultaneous implementation, the duration of the transition of step-shaped exposure to ring-shaped exposure can be shortened, by which the throughput is increased.

(2) Using a single device, both step-shaped exposure and also ring-shaped exposure of the peripheral area of the wafer can be done without making available two exposure devices, that is, one exposure device for step-shaped exposure of the peripheral area of the wafer and one exposure device for ring-shaped exposure of the peripheral area. This advantage if achieved by providing the present device for exposure of the peripheral area of a semiconductor wafer having a photoresist applied to its surface, wherein the device includes a rotary carrier on which the wafer is placed, and which rotates the wafer and an X-Y carrier for moving the rotary carrier parallel to the wafer surface and at the same time in orthogonally intersecting directions. A first exit part for the exposure light is located at the first station, which radiates exposure light onto the wafer on the rotary carrier which is moved by the above described X-Y carrier in orthogonally intersecting directions, and which exposes the peripheral area of the wafer in a step shape. A second exit part for the exposure light is located at a second station which radiates exposure light onto the wafer on the rotary carrier which rotates and which exposes the peripheral area of the wafer in a step shape. According to the invention, the device can be produced at low costs by executing exposure at two stations because the control systems do not become as large as in exposure at the same station.

(3) Using a single device, both step-shaped exposure and also ring-shaped exposure of the peripheral area of the wafer can be done without making available two exposure devices; that is, one exposure device for step-shaped exposure of the peripheral area of the wafer and one exposure device for ring-shaped exposure of the peripheral area. This advantage is achieved by the present device which exposes the peripheral area of a semiconductor wafer with peripheral edge provided with a singular point with respect to its shape and with a photoresist applied to its surface, wherein the device includes a rotary carrier on which the wafer is placed, and which rotates the wafer and a X-Y carrier for moving the rotary carrier parallel to the wafer surface and at the same time in orthogonally intersecting directions. A sensor is provided for determining the state in which the wafer is placed on the rotary carrier, the position of the singular point of the wafer and the positions of alignment marks which are recorded on the wafer. Also, a control means is provided which, on the basis of the output of the sensor, drives the X-Y carrier which at the same time rotates the rotary carrier, and which controls the position of the rotary carrier and its angle of rotation to stipulated values. A first exit part for the exposure light is located at a first station which radiates exposure light onto the wafer on the rotary carrier which is moved by the X-Y carrier in orthogonally intersecting directions, and which exposes the peripheral area of the wafer in a step shape. A second exit part for the exposure light is located at a second station which radiates the exposure light onto the wafer on the rotary carrier which rotates and moves according to the edge position of the wafer in its radial direction and which exposes the peripheral area of the wafer in a ring shape. In this way, the peripheral area of the wafer can be exposed both in a step shape and a ring shape with high accuracy and high efficiency. Furthermore, by the arrangement of the second exit part which radiates the exposure light onto the wafer on the rotary carrier which rotates and moves according to the edge position of the wafer in its radial direction and which exposes the peripheral area of the wafer in a ring shape, the peripheral area of the wafer can be exposed with a constant exposure width even if the center of the wafer deviates from the center of rotation of the rotary carrier.

(4) The area to be exposed can be subjected to exposure of the peripheral area with high precision even in the case in which with respect to the direction of the "ori-fla" of the semiconductor wafer and the position of the "notch", the site has a deviation at which the exposure pattern is formed. This effect is accomplished by the present device described in paragraph (3) for exposure of the peripheral area of a wafer wherein the sensor consists of means for determining the position of the peripheral area of the wafer which determines the position of the peripheral area of the wafer on the rotating rotary carrier, and of alignment units which determine the positions of the alignment marks recorded on the wafer. The control means stores position information about the alignment marks and, based on the output of the means for determining the position of the peripheral area of the wafer, determines the amount of deviation of the wafer center from the center of rotation of the rotary carrier and the position of the singular point of the wafer. The control means controls the positions of the rotary carrier and its angle of rotation on the first and second stations to stipulated values based on the amount of deviation, the position of the singular point of the wafer, the stored position information about the alignment marks and based on the coordinates of the alignment mark positions determined by the alignment units.

(5) The light source part for purposes of exposure can be standardized, the device can be reduced in size and furthermore cost can be reduced by the device described hereinabove which includes a unit which introduces the exposure light into the first and second exit parts and consists of a light source part, first fibers for introducing the light, second fibers for introducing the light, a holding part which keeps the light incidence ends of the first and second fibers at a fixed distance to one another, and of a drive device for the holding part which drives the holding part. The light exit ends of the first and second fibers for introducing light each are connected to the first and second exit parts. In the case of emitting the exposure light from the first exit part for the exposure light by means of the drive device for the holding part, the holding part is driven such that the light incidence end of the first fibers is positioned in the optical path of emission from the light source part. In the case of emitting exposure light from the second exit part by means of the drive device for the holding part, the holding part is driven such that the light incidence end of the second fibers is positioned in the optical path of emission from the light source part.

Furthermore, the same amount of exposure and the same illumination intensity, as in an arrangement having two light source parts, can be obtained. Also, an undesirably long treatment time can be prevented by changing the light over from the light source part and by which the exposure light is introduced via the first and second fibers for introducing the light into the first and second exit parts for the exposure light.

It is to be understood that although preferred embodiments of the invention have been described, various other embodiments and variations may occur to those skilled in the art. Any such other embodiments and variations which fall within the scope and spirit of the present invention are intended to be covered by the following claims.

We claim:

1. Process for exposing and irradiating, using exposure light, a peripheral area of a semiconductor wafer having a peripheral edge, which is provided with a singular shaped point, and a surface on which a photoresist is applied and a pattern is formed, said surface having unnecessary resist outside an area in which the pattern is formed, said outside area being exposed to the exposure light, comprising the steps of:

a) determining and storing position information relating to alignment marks that are formed on the semiconductor wafer;
   b) placing the wafer on a rotary carrier which is positioned at a first station;
   c) determining and storing the position in which the wafer is placed on the rotary carrier and the position of the singular shaped point;
   d) moving the rotary carrier based on the determined and stored position in which the wafer is placed, based on the determined and stored position of the singular shaped point of the wafer and based on stored position information of the alignment marks such that the alignment marks can be determined;
   e) determining and storing the positions of the alignment marks;
   f) moving the rotary carrier based on the determined and stored positions of the alignment marks such that the exposure light from a first exit part for the exposure light is radiated onto a first exposure initial position on the wafer;
   g) irradiating the peripheral area of the wafer with exposure light from the first exit part by moving the rotary carrier parallel to the wafer surface in orthogonally intersecting directions causing step-shaped exposure of part of the peripheral area of the wafer;
   h) moving the rotary carrier from the first station to a second station and rotating the rotary carrier, based on the determined and stored position in which the wafer is placed, and based on the determined and stored position of the singular shaped point of the wafer, so that the exposure light from a second exit part is radiated onto a second exposure initial position in a not yet exposed part of the peripheral area of the wafer; and
   i) turning the rotary carrier at the second station and radiating the exposure light from the second exposure initial position onto the not yet exposed part of the wafer causing ring-shaped exposure of the peripheral area of the wafer.

2. A device for exposing a peripheral area of a semiconductor wafer to exposure light, the wafer having a surface on which a photoresist is applied, comprising:

a rotary carrier on which the wafer is placed for rotating the wafer;
   an X-Y carrier for moving the rotary carrier parallel to the wafer surface and, simultaneously, in orthogonally intersecting directions;
   control means for controlling operation of the rotary carrier and the X-Y carrier;
   a first exit part having a first exposure light source and which is located at a first station for emitting exposure light onto the wafer on the rotary carrier, said control means causing movement of the X-Y carrier in orthogonally intersecting directions so as to expose the photoresist on a first peripheral area of the wafer in a step-shape; and
   a second exit part having a first exposure light source and which is located at a second station for radiating the exposure light onto the wafer on the rotary carrier, said control means causing rotation of the rotary carrier so as to expose the photoresist on a second peripheral area of the wafer in a ring-shape after producing movement of said X-Y carrier causing said rotary carrier to be displaced from said first station to said second station.

3. A device for exposing a peripheral area of a semiconductor wafer to exposure light, the wafer having a surface on which a photoresist is applied and a peripheral edge provided with a singular shaped point, comprising:

a rotary carrier on which the wafer is placed for rotating the wafer;
   an X-Y carrier for moving the rotary carrier parallel to the wafer surface and, simultaneously, in orthogonally intersecting directions;
   a sensor for determining a position in which the wafer is placed on the rotary carrier, a position of the singular shaped point of the wafer and the positions of alignment marks recorded on the wafer;
   a control means for, on the basis of an output of the sensor, driving the X-Y carrier and simultaneously rotating the rotary carrier, said control means controlling the position of the rotary carrier and its angle of rotation to stipulated values;
   a first exit part for the exposure light which is located at a first station for radiating exposure light onto the wafer positioned on the rotary carrier which is moved by the X-Y carrier in orthogonally intersecting directions so as to expose the peripheral area of the wafer in a step shape; and
   a second exit part for the exposure light which is located at a second station for radiating the exposure light onto the wafer positioned on the rotary carrier, wherein said rotary carrier rotates and moves according to an edge position of the wafer in its radial direction so as to expose the peripheral area of the wafer in a ring shape.

4. The device according to claim 3, wherein the sensor includes means for determining the position of the peripheral area of the wafer which determines the position of the peripheral area of the wafer on the rotating rotary carrier, said sensor further including alignment units which determine the positions of the alignment marks recorded on the wafer, wherein the control means stores position information about the alignment marks and, based on an output of the means for determining the position of the peripheral area of the wafer, determines the amount of deviation of a wafer center from a center of rotation of the rotary carrier and the position of the singular shaped point of the wafer, and wherein the control means controls the positions of the rotary carrier and its angle of rotation on the first and second stations to stipulated values based on the amount of deviation, the position of the singular point of the wafer, the stored position information about the alignment marks and further based on coordinates of the alignment mark positions determined by the alignment units.

5. The device according to claim 4, further including a unit for guiding the exposure light into the first and second exit parts which includes a light source part, first fibers for introducing the light, second fibers for introducing the light, a holding part for keeping light incidence ends of the first and second fibers at a fixed distance to one another, and of a drive device for the holding part which drives the holding part, wherein the light exit ends of the first and second fibers are each connected to the first and second exit parts, wherein, in the case of emitting the exposure light from the first exit part by the drive device for the holding part, the holding part is driven such that the light incidence end of the first fibers for introducing light is positioned in optical path of emission from the light source part, and wherein, in the case of emitting exposure light from the second exit part for the exposure light by the drive device for the holding part, the holding part is driven such that the light incidence end of the second fibers for introducing light is positioned in the optical path of emission from the light source part.

6. The device according to claim 3, further including a unit for guiding the exposure light into the first and second exit parts which includes a light source part, first fibers for introducing the light, second fibers for introducing the light, a holding part for keeping light incidence ends of the first and second fibers at a fixed distance to one another, and of a drive device for the holding part which drives the holding part, wherein the light exit ends of the first and second fibers are each connected to the first and second exit parts, wherein, in the case of emitting the exposure light from the first exit part by the drive device for the holding part, the holding part is driven such that the light incidence end of the first fibers for introducing light is positioned in optical path of emission from the light source part, and wherein, in the case of emitting exposure light from the second exit part for the exposure light by the drive device for the holding part, the holding part is driven such that the light incidence end of the second fibers for introducing light is positioned in the optical path of emission from the light source part.

7. The device according to claim 2, further including a unit for guiding the exposure light into the first and second exit parts which includes a light source part, first fibers for introducing the light, second fibers for introducing the light, a holding part for keeping light incidence ends of the first and second fibers at a fixed distance to one another, and of a drive device for the holding part which drives the holding part, wherein the light exit ends of the first and second fibers are each connected to the first and second exit parts, wherein, in the case of emitting the exposure light from the first exit part by the drive device for the holding part, the holding part is driven such that the light incidence end of the first fibers for introducing light is positioned in an optical path of emission from the light source part, and wherein, in the case of emitting exposure light from the second exit part for the exposure light by the drive device for the holding part, the holding part is driven such that the light incidence end of the second fibers for introducing light is positioned in the optical path of emission from the light source part.

* * * * *

UNITED STATES PATENT AND TRADEMARK OFFICE
CERTIFICATE OF CORRECTION

PATENT NO.  : 5,929,976
DATED       : July 27, 1999
INVENTOR(S) : Isamu Shibuya, Takeshi Minobe, Yoshiki Mimura It is certified that error appears in the above-indentified patent and that said Letters Patent is hereby corrected as shown below:

On the title page item,

[75] Inventors: Isamu Shibuya; Takeshi Minobe;
                Yoshiki Mimura, all of Yokohama, Japan Signed and Sealed this Seventh Day of December, 1999

Attest:

Q. TODD DICKINSON

Attesting Officer

Acting Commissioner of Patents and Trademarks